US010232372B2

(12) United States Patent
Smith et al.

(10) Patent No.: US 10,232,372 B2

(45) Date of Patent: Mar. 19, 2019

(54) INTEGRATED NANOFLUIDIC ARRAYS FOR HIGH CAPACITY COLLOID SEPARATION

(71) Applicant: International Business Machines Corporation, Armonk, NY (US)

(72) Inventors: Joshua T. Smith, Croton on Hudson, NY (US); Benjamin H. Wunsch, Mt. Kisco, NY (US); Cornelia T. Yang, Andover, MA (US)

(73) Assignee: INTERNATIONAL BUSINESS MACHINES CORPORATION, Armonk, NY (US)

( * ) Notice: Subject to any disclaimer, the term of this patent is extended or adjusted under 35 U.S.C. 154(b) by 65 days.

(21) Appl. No.: 15/467,559

(22) Filed: Mar. 23, 2017

(65) Prior Publication Data

US 2017/0197215 A1 Jul. 13, 2017

Related U.S. Application Data

(62) Division of application No. 15/160,524, filed on May 20, 2016, now Pat. No. 9,833,782, which is a division (Continued)

(51) Int. Cl.

| | |
|---|---|
| ***B28B 1/00*** | (2006.01) |
| ***B01L 3/00*** | (2006.01) |
| ***H01L 21/44*** | (2006.01) |

(52) U.S. Cl.

CPC ... *B01L 3/502761* (2013.01); *B01L 3/502715* (2013.01); *B01L 3/502746* (2013.01); *B01L 3/502753* (2013.01); *B01L 2200/0652* (2013.01); *B01L 2300/0861* (2013.01); *B01L 2300/0864* (2013.01);

(Continued)

(58) Field of Classification Search

CPC .............. B28B 1/00; B01L 3/00; H01L 21/44

USPC ....... 422/502, 503, 504, 554, 552, 553, 547; 436/43, 174, 180; 264/650; 29/592

See application file for complete search history.

(56) References Cited

U.S. PATENT DOCUMENTS

| | | | | |
|---|---|---|---|---|
| 6,981,522 B2 * | 1/2006 | O'Connor | B01F 5/064 | 137/559 |
| 2014/0030811 A1 * | 1/2014 | Cao | B01L 3/502707 | 436/94 |

OTHER PUBLICATIONS

Joshua T. Smith, et al.; "Integrated Nanofluidic Arrays for High Capacity Colloid Separation"; U.S. Appl. No. 14/940,631, filed Nov. 13, 2015.

(Continued)

*Primary Examiner* — Brian J. Sines

(74) *Attorney, Agent, or Firm* — Cantor Colburn LLP; Vazken Alexanian

(57) ABSTRACT

A technique relates to an integrated nanofluidic device. A loading layer includes an inlet channel reservoir, a diverted fraction reservoir, and a passed fraction reservoir. A sorting layer is attached to the loading layer such that fluid is permitted to communicate between the loading and sorting layers, where the sorting layer includes a bank of sorting elements. The sorting layer has inlet channels and outlet channels connected to the sorting elements, and the inlet channel reservoir is connected to the inlet channels by an inlet feed hole. The diverted fraction reservoir is connected to the outlet channels by a diverted fraction outlet feed hole, and the passed fraction reservoir is connected to the sorting elements by passed fraction feed holes. The passed fraction feed holes are respectively connected to the sorting elements.

20 Claims, 17 Drawing Sheets

Related U.S. Application Data of application No. 14/940,631, filed on Nov. 13, 2015, now Pat. No. 9,700,891.

(52) U.S. Cl.
CPC .................. *B01L 2300/0874* (2013.01); *B01L 2300/0887* (2013.01); *B01L 2300/0896* (2013.01); *B01L 2400/049* (2013.01); *B01L 2400/0415* (2013.01); *B01L 2400/0433* (2013.01); *B01L 2400/0487* (2013.01); *B01L 2400/086* (2013.01)

(56) References Cited

OTHER PUBLICATIONS

Joshua T. Smith, et al.; "Integrated Nanofluidic Arrays for High Capacity Colloid Separation"; U.S. Appl. No. 15/160,524, filed May 20, 2016.
List of IBM Patents or Patent Applications Treated as Related—Date Filed: Apr. 24, 2017; 2 pages.

* cited by examiner

INTEGRATED NANOFLUIDIC ARRAYS FOR HIGH CAPACITY COLLOID SEPARATION

DOMESTIC PRIORITY

This application is a divisional of and claims priority from U.S. patent application Ser. No. 15/160,524, filed on May 20, 2016, entitled "INTEGRATED NANOFLUIDIC ARRAYS FOR HIGH CAPACITY COLLOID SEPARATION", which is a divisional of U.S. patent application Ser. No. 14/940,631, filed on Nov. 13, 2015, entitled "INTEGRATED NANOFLUIDIC ARRAYS FOR HIGH CAPACITY COLLOID SEPARATION", the entire contents of which are incorporated herein by reference.

BACKGROUND

The present invention relates to nanofluidic chips, and more specifically, to integrated nanofluidic arrays for high capacity colloid separation.

Nanofluidics is the study of the behavior, manipulation, and control of fluids that are confined to structures of nanometer (typically 1-100 nanometers (nm)) characteristic dimensions. Fluids confined in these nanometer structures exhibit physical behaviors not observed in larger structures, such as those of micrometer dimensions and above, because the characteristic physical scaling lengths of the fluid (e.g., Debye length, hydrodynamic radius) very closely coincide with the dimensions of the nanostructure itself. In nanofluidics, fluids are moved, mixed, separated, or otherwise processed. Numerous applications employ passive fluid control techniques like capillary forces. In some applications external actuation means are additionally used for a directed transport of the fluids.

SUMMARY

According to one embodiment, an integrated nanofluidic device is provided. The integrated nanofluidic device includes a loading layer including an inlet channel reservoir, a diverted fraction reservoir, and a passed fraction reservoir. The integrated nanofluidic device includes a sorting layer attached to the loading layer such that fluid is permitted to communicate between the loading and sorting layers, and the sorting layer includes a bank of sorting elements. The sorting layer has inlet channels and outlet channels connected to the sorting elements, and the inlet channel reservoir is connected to the inlet channels by an inlet feed hole. The diverted fraction reservoir is connected to the outlet channels by a diverted fraction outlet feed hole, and the passed fraction reservoir is connected to the sorting elements by passed fraction feed holes. The passed fraction feed holes are respectively connected to the sorting elements.

According to one embodiment, an integrated nanofluidic device is provided. The integrated nanofluidic device includes a loading layer including an inlet channel reservoir, an inlet vias reservoir, a diverted fraction reservoir, and a passed fraction reservoir. The integrated nanofluidic device includes a sorting layer attached to the loading layer such that fluid is permitted to communicate between the loading and sorting layers, and the sorting layer includes a bank of sorting elements. The sorting layer has inlet channels and outlet channels connected to the sorting elements, and the inlet channel reservoir is connected to the inlet channels by an inlet feed hole. The diverted fraction reservoir is connected to the outlet channels by a diverted fraction outlet feed hole, and the passed fraction reservoir is connected to the sorting elements by passed fraction feed holes. The passed fraction feed holes are respectively connected to the sorting elements, and the inlet vias reservoir is connected to the sorting elements by inlet via holes.

According to one embodiment, a method of configuring an integrated nanofluidic device is provided. The method includes providing a loading layer including an inlet channel reservoir, a diverted fraction reservoir, and a passed fraction reservoir, and attaching a sorting layer to the loading layer such that fluid is permitted to communicate between the loading and sorting layers. The sorting layer includes a bank of sorting elements, and the sorting layer has inlet channels and outlet channels connected to the sorting elements. The inlet channel reservoir is connected to the inlet channels by an inlet feed hole, and the diverted fraction reservoir is connected to the outlet channels by a diverted fraction outlet feed hole. The passed fraction reservoir is connected to the sorting elements by passed fraction feed holes, and the passed fraction feed holes respectively connected to the sorting elements.

According to one embodiment, a method of configuring an integrated nanofluidic device is provided. The method includes providing a loading layer including an inlet channel reservoir, an inlet vias reservoir, a diverted fraction reservoir, and a passed fraction reservoir, and arranging a sorting layer attached to the loading layer such that fluid is permitted to communicate between the loading and sorting layers. The sorting layer includes a bank of sorting elements, and the sorting layer has inlet channels and outlet channels connected to the sorting elements. The inlet channel reservoir is connected to the inlet channels by an inlet feed hole, and the diverted fraction reservoir is connected to the outlet channels by a diverted fraction outlet feed hole. The passed fraction reservoir is connected to the sorting elements by passed fraction feed holes, and the passed fraction feed holes respectively connected to the sorting elements. The inlet vias reservoir is connected to the sorting elements by inlet via holes.

Additional features and advantages are realized through the techniques of the present invention. Other embodiments and aspects of the invention are described in detail herein and are considered a part of the claimed invention. For a better understanding of the invention with the advantages and the features, refer to the description and to the drawings.

DETAILED DESCRIPTION

Figure 1A:
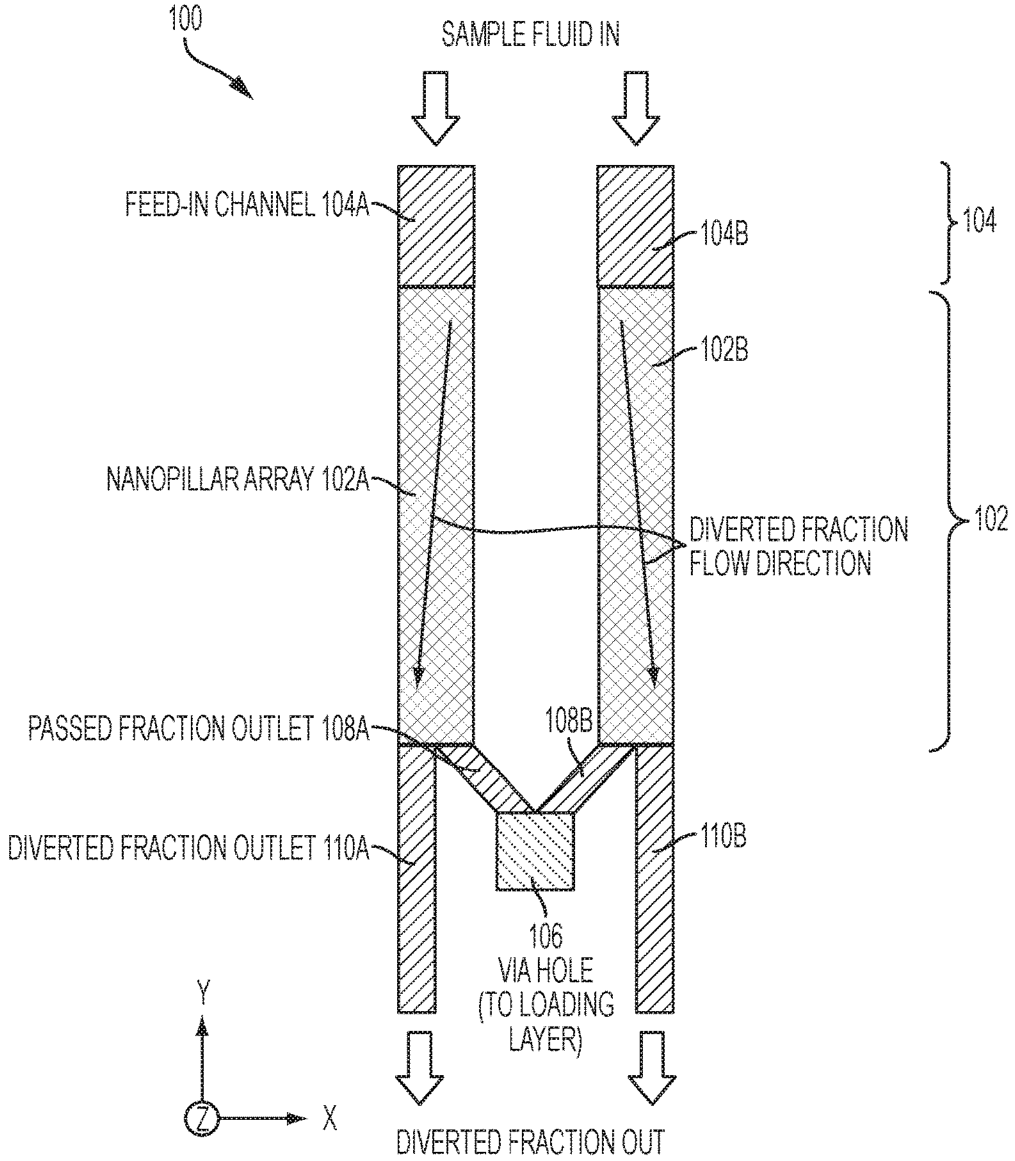
FIG. 1A is a schematic of a top-down view of nanopillar arrays linked by their inputs and output streams to form a single sorting element according to an embodiment.

Nanofluidics is a field of nanotechnology and engineering that manipulates fluids using devices where the critical structure dimensions are the order of nanometers. Their importance stems from the ability to manipulate samples in minute quantities, allowing the miniaturization of analytical and preparative methods that are normally carried out on the milliliter or greater scale. Many important biological, chemical, and material entities, such as proteins, organelles, supramolecular complexes, and colloids, function in fluids, and their manipulation and analysis can be facilitated with nanofluidic devices which can handle small sample sizes.

Colloidal particle separation is of industrial importance and is used, for example, in pharmaceuticals, medical diagnostics, food processing, molecular biology, polymer production, water purification, oil refinement, and high volume chemical synthesis. Of concern is the ability to remove or collect particles of a given size, either to prevent clogging or contamination, or because of the beneficial properties of the given colloid. This is of particular interest in complex colloids, such as bio-colloids (such as, for example, nucleic acids, proteins, RNA-protein complexes, vesicles, etc.) in which purity of sample is paramount. Several methods exist for carrying out this separation process, the most predominant being size-exclusion chromatography and derivatives, gel electrophoresis and derivatives, and size-selective membranes. Chromatography columns and gels are widely employed in industry and research, where they can be scaled to large volumes (particularly columns); however, they have the disadvantages of being batch processes, requiring down time to reload and refurbish. In addition, increases in separation, selectivity, and efficiency require larger columns/gels and more strenuous running conditions, which can be cost prohibitive. Separation membranes can achieve high separation efficiencies, but they act as filters allowing only a selective cut-off of particles to flow through. The remaining larger particles become entrapped in the filter. As such, this requires routine maintenance and replacement of the membrane, and in general can prevent the effective recovery of the filtered material.

Nanopillar arrays produced with silicon nanotechnology can overcome these issues of traditional particle separation, allowing continuous flow where all particle inputs can be collected, while maintaining high efficiency and low energy input. The small output size of an individual array requires that a larger sample be divided into smaller aliquots and run in a large number of arrays simultaneous. Nanopillar arrays allow separation of colloid materials in the 10-100 nm range, which is an advantage over the more dominate micropillar arrays that operate in the micron range. High integration micro-fluidic systems exist and have been demonstrated, but there has been no comparable solution for nanofluidics, in part because most micro-fluidics are produced in flexible plastics, while nanofluidics such as nanopillar arrays are generally more effectively produced in silicon. Therefore, there is a need to address the ability to integrate nanofluidic devices such as nanopillar arrays and how to address each element's input and output, as provided in one or more embodiments.

Embodiments address several issues concerning use of nanopillar sorting arrays (i.e., also referred to as arrays and/or sorting arrays) for large volume particle separations (such as, e.g., passing greater than 1 microliter per second ($\mu Ls^{-1}$) of fluid). In the state of the art, nanopillar arrays, used to separate particles by size, generally are constructed on the order of 10×100 square micrometers ($\mu m^2$) and require at least one input and output fluid connection to operate. The fluid flowing through a single nanopillar array is typically on the order of 1-10 nanoliters per seconds ($nLs^{-1}$). Therefore, to process even small volumes such as 100-1000 μL, typical of biological and chemical analytical specimens, in a timely manner requires an appropriate scaling of the nanopillar arrays combined with parallel operation.

Embodiments incorporate nanopillar sorting arrays as a particular element in the construction of a larger colloidal sorting device. Nanopillar arrays, which consist of consecutive rows of lithographically defined pillars (on the order of 100's nm in diameter) skewed at an angle to the direction of the array axis, can separate colloidal objects by size and shape, where the critical particle size of the array determines the size-pass. Particles (colloids) of a size smaller than the critical size pass through the array unaffected, while particles larger than the critical size are displaced to one side of the array (according to the diverted fraction flow direction) where the larger particles collect into a stream against the channel wall. Using this device as a building block, a more complex sorting device may be fabricated by integrating the arrays and the required interconnecting fluidic channels into a single stacked chip architecture, according to embodiments.

Nanopillar arrays separate particals spatially using a periodic lattice of 2D pillars within a fluidic channel, in which sequential rows of pillars are offset to form an axis rotated slight off from the channel axis. The angle between the pillar offset and the channel axis is the critical migration angle, $\theta_c$. Particles with a diameter $d_p$ greater than the critical diameter set by the array, $d_c$, are diverted to the edge of the array at an angle $\theta_c$, while particles with $d_p$ less than $d_c$ flow along the channel and are passed out of the array, with angle of effectively zero. If a concentrated jet of a mixture of particles with a narrow distribution cross-section are introduced at one edge of an array of width W, those particles with $d_p \geq d_c$ will traverse W after travelling a length $$L_c = \frac{w}{\tan\theta_c}.$$

The resolution, R, of separation depends on the cross-sectional widths, w, of the diverted (1) and passed (2) particle fractions, and their distributions' centers of mass u:

$$R = \frac{|u_1 - u_2|}{\frac{1}{2}(w_1 + w_2)}.$$

For an acceptable separation, R should be ~1, implying that if the diverted and passed distributions have approximately equal cross-sectional width then: $w=|u_1-u_2|=\Delta u$. The distribution separation Δu thus sets the minimum width required for the nanopillar array: W=Δu. This in turn fixes the length, $L_c$, defining a minimum nanopillar area required for a chosen resolution: $A=WL_c$. Increasing the width W increases resolution, but also necessitates a longer nanopillar array. A longer array increases the hydrodynamic resistance, thus reducing the maximum practical flow velocity that can be achieved, as well as increasing the time for diffusion, which in turn broadens the distribution widths w and leads to reduced resolution. In practice, narrow distributions of particles with w~5-10 μm can be injected readily into nanopillar arrays; however diffusion typically broadens the distributions, especially for particles of $d_p<50$ nm, requiring a W~50-100 μm to achieve R~1. For $\theta_c=5.7°$ this implies $L_c$~500-1000 μm, setting a practical array area of A~0.025-0.1 $mm^2$. This device area implies, for a 1 $cm^2$ chip, the density of nanopillar arrays can be on the order of ~1,000 devices/$cm^2$.

To operate any nanopillar device requires a set of input and output channels which feed in liquid and samples, and transfer out the products and waste. When these channels connect to several devices, they form a network, whose area must be accounted for in determining the packing density. This means practically that the packing density will be decreased due to the presence of the nanochannels. To increase packing density, therefore, requires careful consideration of the geometry and connectivity of the nanochannel network with the nanopillar devices.

The problem of increasing flow rate thus becomes one of generating higher densities of nanopillar arrays within a single device chip, having large numbers of arrays to divide and process the sample fluid in parallel. To obtain a high density of nanopillar arrays on chip, the fluid interconnects have to be laid out so that sample can be flowed into the array, and the two outputs (passed and diverted) spatially separated and collected separately (as discussed in embodiments). Practically, this requires distributing a single input stream of particles to all of the input channels of the individual nanopillar arrays, while simultaneously linking together all of the output channels of all the nanopillar arrays together into a single output stream. For more complex combinations of input and output streams, each individual stream is distributed to each nanopillar array, and each output subsequently collected into a single stream. This turns out to be geometrically infeasible or impossible within the plane of a single chip, but is possible with a multi-level approach, in which some of the input and output streams are diverted to an intermediate chip layer above/below the nanopillar arrays according to embodiments. Accordingly, embodiments describe such a stacked-level integrated array device and its benefits in high capacity sorting.

Now turning to the figures, FIG. 1A is a schematic of a general design in which two nanopillar arrays 102A and 102B are linked by their input and output streams to form a single sorting element 100 (i.e., loader) according to an embodiment. The nanopillar arrays 102A and 102B may generally be referred to as nanopillar arrays 102. The sorting element 100 comprises two monoloaders with inputs and outputs connected. The sorting element 100 includes feed-in channels 104A and 104B respectively connected to nanopillar arrays 102A and 102B. As understood by one skilled in the art, the nanopillar arrays 102A and 102B are configured to divert fractions (i.e., larger particle) according to the diverted fraction flow direction (also referred to as the critical angle of the nanopillar array) in order to exit along the respective diverted fraction outlets 110A and 110B. The diverted fraction outlets 110A and 110B may generally be referred to as diverted fraction outlets 110.

On the other hand, the passed fraction flowing through passed fraction outlets 108A and 108B is directed to via hole 106, and the via hole 106 permits the passed fraction to reach a loading layer. The passed fraction outlets 108A and 108B may be referred to as passed fraction outlets 108. The passed fraction may be smaller particles that are not affected by the respective diverted fraction flow directions (i.e., critical angles) of the nanopillar arrays 102A and 102B. In various embodiments, the diverted fraction flow direction in the nanopillar arrays 102 may be shown at a particular angle to collect the diverted faction (e.g., larger particles) toward the outside (by diverted fraction outlets 110A and 110B) while the passed fraction (e.g., smaller particles) are collected toward the inside (by via hole 106). It should be appreciated that the diverted fraction flow direction may be reversed, such that the diverted factions (e.g., larger particles) are collected toward the inside of the sorting elements 100 while the passed fractions (e.g., smaller particles) are collected toward the outside.

Figure 1B:
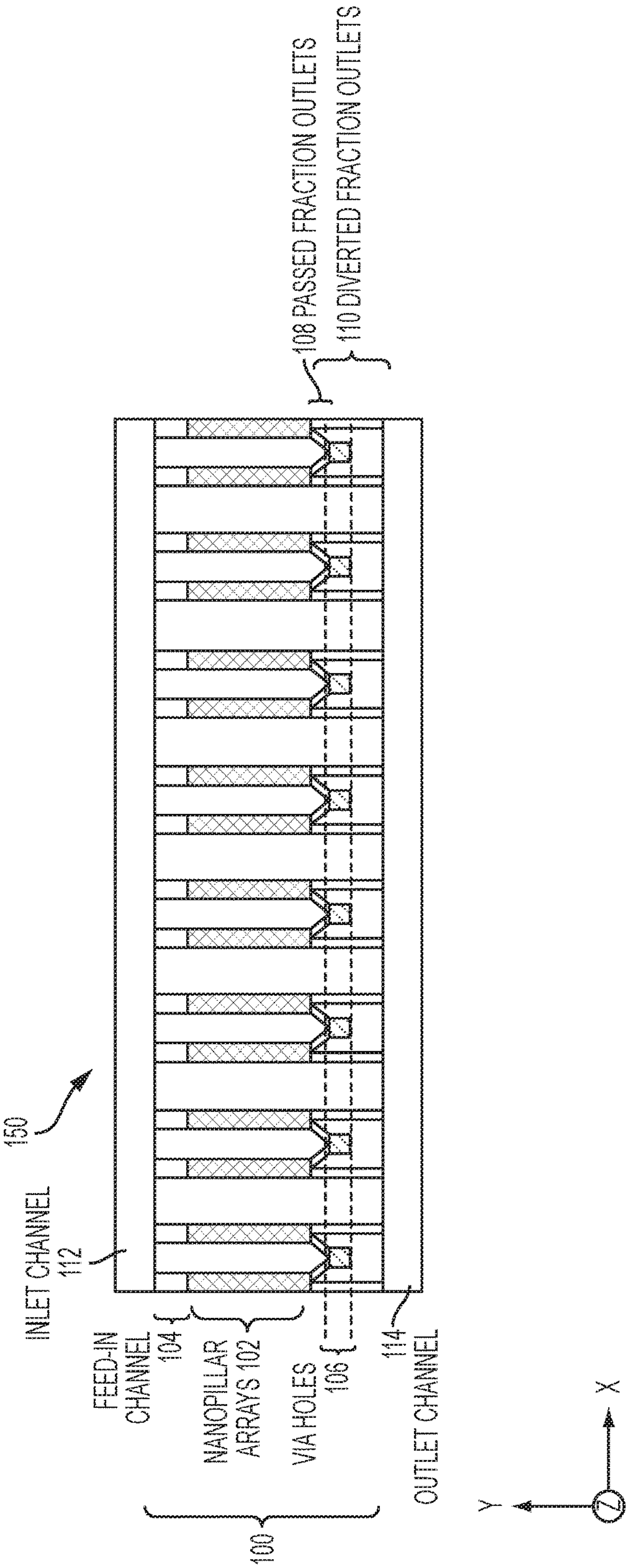
FIG. 1B is a schematic of a top-down view of a single bank of sorting elements interlinked to operate in parallel to process fluid according to an embodiment.
Figure 1C:
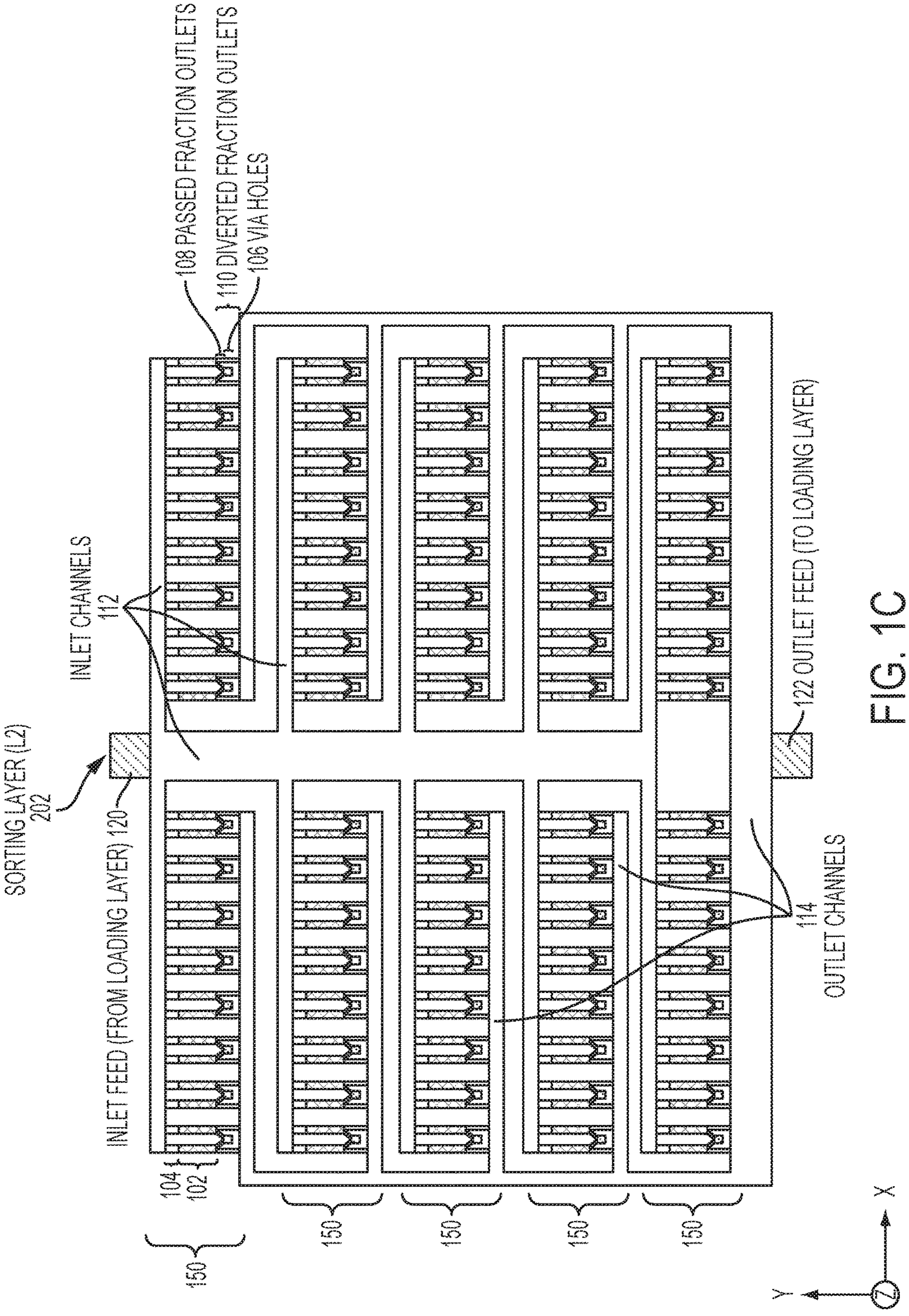
FIG. 1C is a schematic of top-down view of a sorting layer with rows of banks interlinked for parallel processing of fluid according to an embodiment.

FIGS. 1B and 1C are schematics illustrating how individual sorting elements 100 may be interlinked to produce banks of sorting elements 100 for parallel processing according to an embodiment. FIG. 1B is a schematic of a single bank 150 of sorting elements 100 interlinked to operate in parallel, in which their nanopillar arrays 102 simultaneously (i.e., in parallel) process fluid from inlet channel 112 that feeds into feed-in channels 104. The diverted fraction (i.e., larger particles affected by the critical angle of the nanopillar arrays 102) flow to the outlet channel 114 through diverted fraction outlets 110. Conversely, the passed fraction (i.e., smaller particles not affected by the critical angle of the nanopillar arrays 102) flow to the via holes 106 through passed fraction outlets 108. The bank 150 of interlinked sorting elements 100 allows for parallel processing of a larger amount of fluid (having particles to be sorted) than a single sorting element 100.

Further, FIG. 1C is a schematic of a sorting layer (L2) 202 illustrating rows of banks 150 interlinked for parallel processing of fluid by the sorting elements 100 according to an embodiment. In this example configuration, the sorting layer 202 depicts five rows of banks 150 in two columns. It should be appreciated that the sorting layer 202 may be modified to have more or fewer rows of banks 150 and/or columns of banks 150.

In FIG. 1C, the sorting elements 100 of each bank 150 have their feed-in channels 104 connected to branches of the same inlet channel 112, such that each of the banks 150 simultaneously receives fluid from inlet channels 112 for parallel sorting by the sorting elements 100. The inlet channels 112 receive fluid input through inlet feed hole 120 from a loading layer (L1) 201 (shown in FIG. 2A). Similarly, in FIG. 1C, the sorting elements 100 of each bank 150 have their diverted fraction outlets 110 connected to branches of the same outlet channel 114, such that each of the banks 150 simultaneously outputs fluid (e.g., larger particles) into outlet channels 114 after parallel sorting by the sorting elements 100. The diverted fraction outlet channels 110 output fluid down into diverted fraction outlet feed hole 122 that connects to the loading layer (L1) 201. Additionally, the sorting elements 100 of each bank 150 are configured to output the passed fractions (e.g., smaller particles) through the passed fraction outlets 108, down into the passed fraction via holes 106, and into passed fraction outlet channels 276 in the loading layer 201 of FIG. 2A.

FIGS. 1A, 1B, and 1C illustrate the progression of interconnecting sorting elements 100 to form banks 150, and the banks 150 are interlinked to form the sorting layer 202 with increased fluid flow. The sorting layer 202 is a chip that is stacked on the loading layer 201 (i.e., another chip).

Figure 2A:
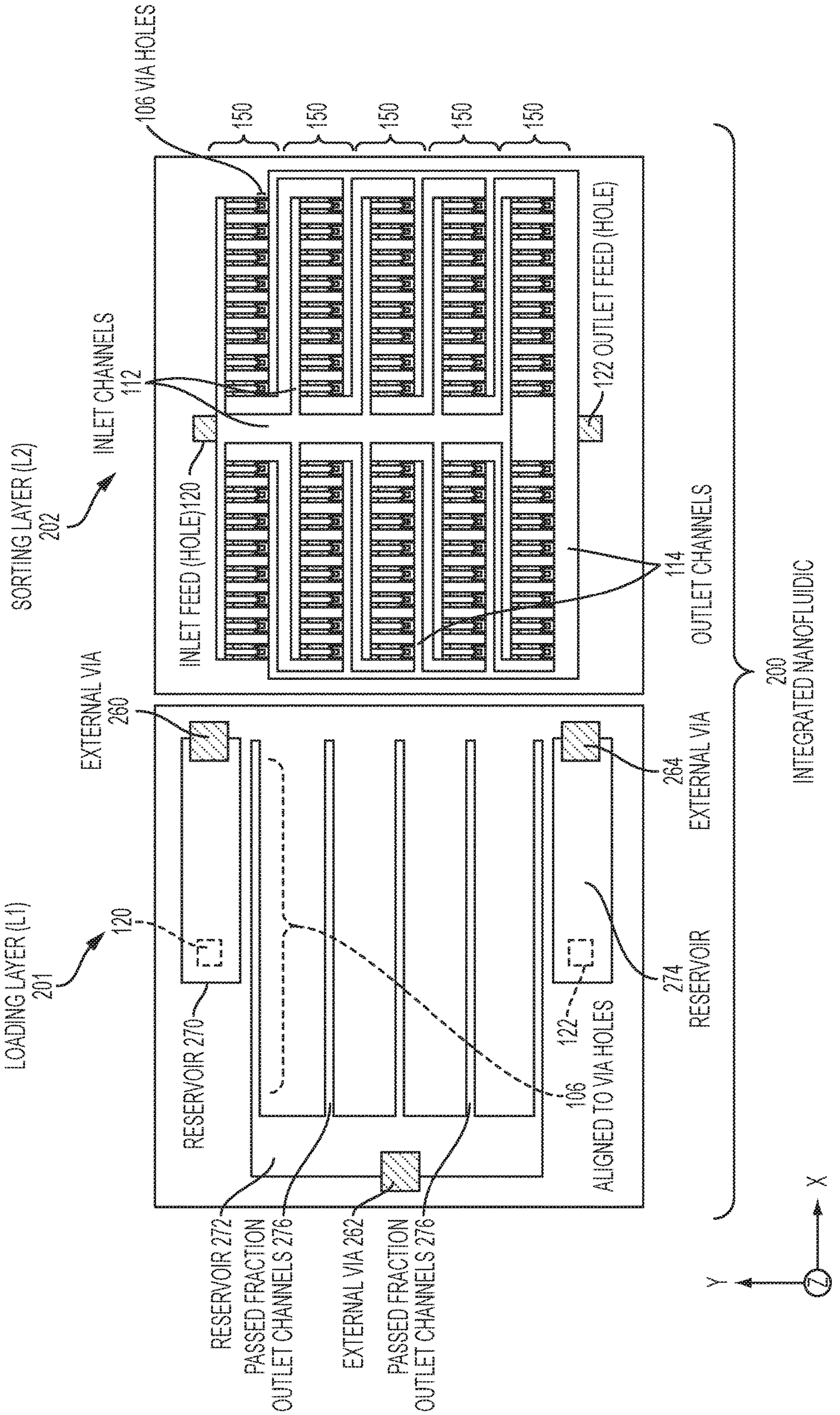
FIG. 2A is a schematic of an integrated nanofluidic device having a microfluidic loading/unloading layer and a nanofluidic sorting layer according to an embodiment.

According to an embodiment, FIG. 2A is a schematic of an integrated nanofluidic device 200 having the two layer stack of chips, which are the microfluidic loading/unloading layer 201 and the nanofluidic sorting layer 202. The loading and unloading layer 201 may be generally referred to as the loading layer, and the loading layer 201 is designed for loading in the fluid containing the sample and for collecting the fluid having the sample sorted by the sorting elements 100. In FIG. 2A, the integrated nanofluidic device 200 is formed by stacking the sorting layer 202 (chip) on top of the loading layer 201, such that fluid may flow between the loading layer 201 and the sorting layer 202 as discussed herein.

The microfluidic loading layer 201 includes a (sample loading) inlet channel reservoir 270 that directly interfaces through an external via hole 260 to an external drive pump. The external via hole 260 allows outside connection to the integrated nanofluidic device 200.

Figure 4A:
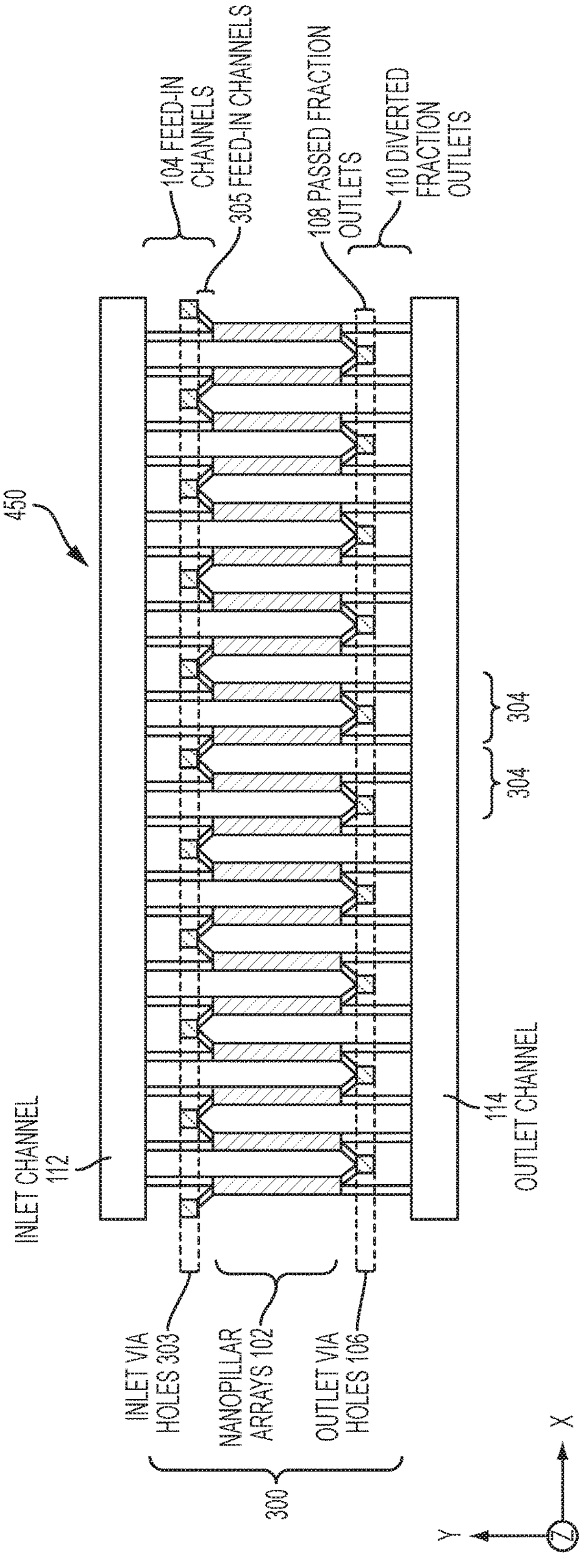
FIG. 4A is a schematic of a top-down view of a single bank of dual-loaders interconnected as sorting elements to operate in parallel according to an embodiment.
Figure 4B:
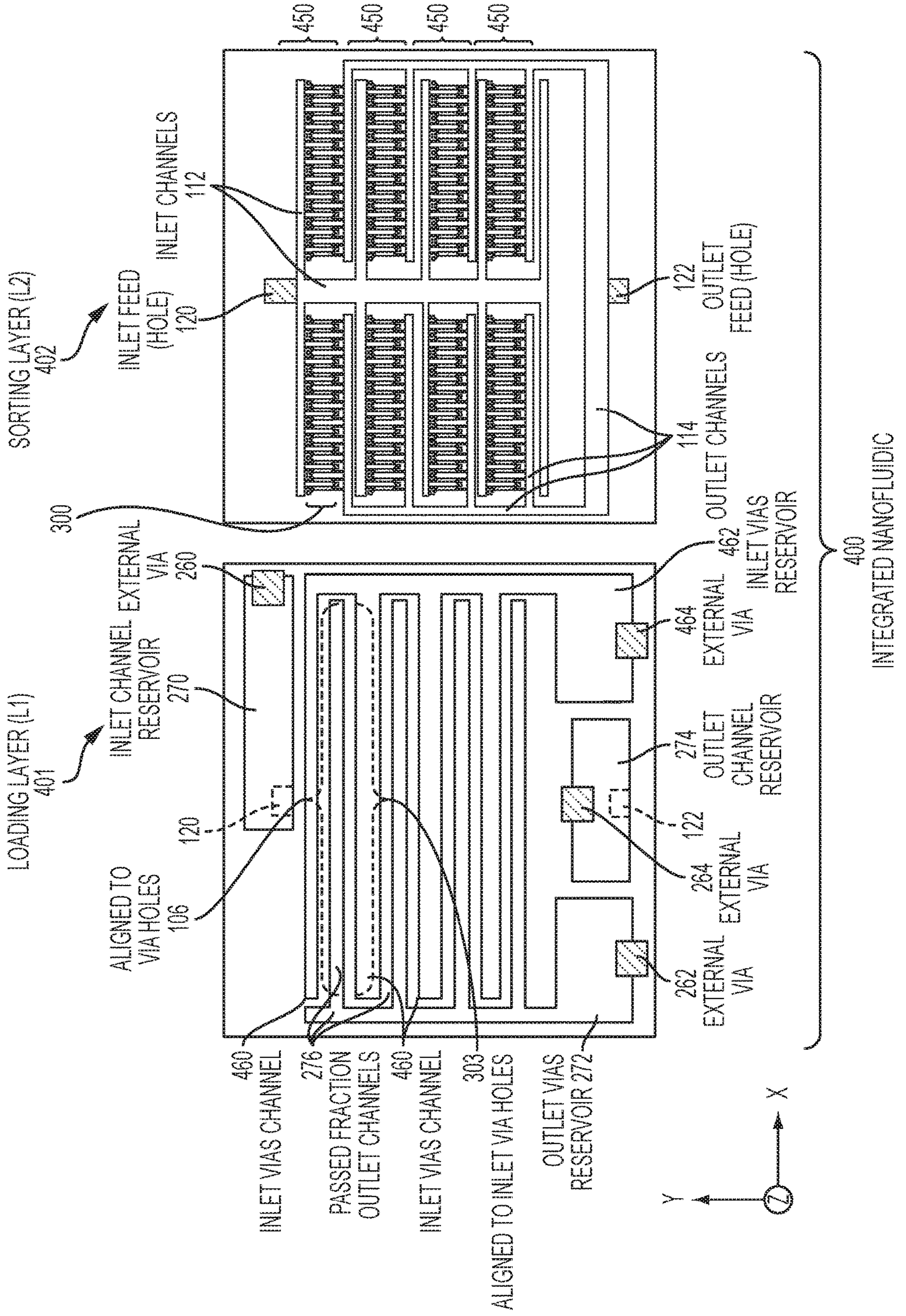
FIG. 4B is a schematic of an integrated nanofluidic device having a microfluidic loading/unloading layer and a nanofluidic sorting layer according to another embodiment.
Figure 5:
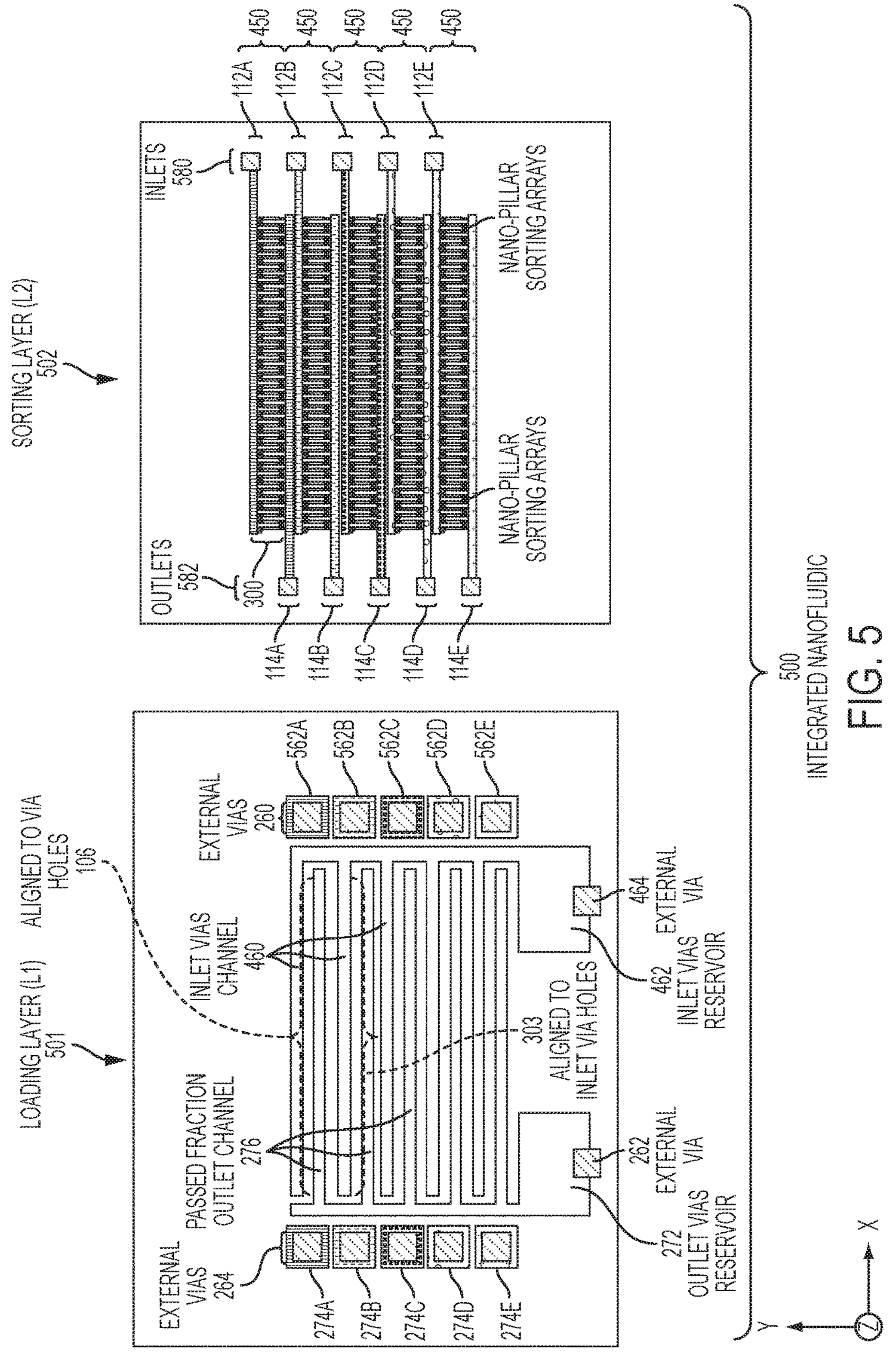
FIG. 5 is a schematic of an integrated nanofluidic device having a microfluidic loading/unloading layer and a nanofluidic sorting layer according to yet another embodiment.

Liquid sample can flow through the (sample loading) inlet channel reservoir 270 to the sorting layer 202 through inlet via holes 120. It should be appreciated that the dashed hole 120 coincides in the loading layer 201 and the sorting layer 202, so as to allow fluid to flow. A network of branching inlet channels 112 extends from the inlet feed holes 120 out to banks 150 of sorting elements 100 (i.e., nanofluidic devices) fabricated in the sorting layer 202. Several configurations of inlet channels 112 are possible. In one implementation, the inlet channels 112 may be a branching “tree” type layout which maximizes the ability to address multiple nanopillar arrays 102 (in sorting elements 100) using a minimum number of through vias 120 (inlet feed holes), as depicted in FIGS. 1C, 2A, and 4B. Another implementation may utilize an array of parallel inlet channels 112 (without the branches all connected to a single trunk) in which an inlet feed hole 120 is needed for each bank 150, as depicted in FIG. 5.

The loading layer 201 includes passed fraction outlet channels 276, and each of the passed fraction outlet channels 276 is aligned to (and connected to) via holes 106 in a row of banks 150, such that the passed fraction outlet channels 276 receive the passed fractions (e.g., smaller particles) that are output through the via holes 106. The passed fractions are collected in the passed fraction reservoir 272, and an external via 262 may be utilized to extract the passed fractions from the passed fraction reservoir 272 using, e.g., a vacuum or negative pressure. In FIG. 2A, five passed fraction outlet channels 276 are formed in the loading layer 201 with holes (not shown so as not to obscure the figure) that coincide with each of the via holes 106 in the five rows of banks 150. Accordingly, the number of passed fraction outlet channels 276 is designed to match the number of rows of bank 150.

The loading layer 201 includes a diverted fraction reservoir 274, and the diverted fraction reservoir 274 is open at the diverted fraction outlet feed hole 122 of the sorting layer 202. The diverted fraction reservoir 274 is designed to receive the diverted fractions (e.g., larger particles) from the outlet channels 114 via the diverted fraction outlet feed hole 122.

Figure 2B:
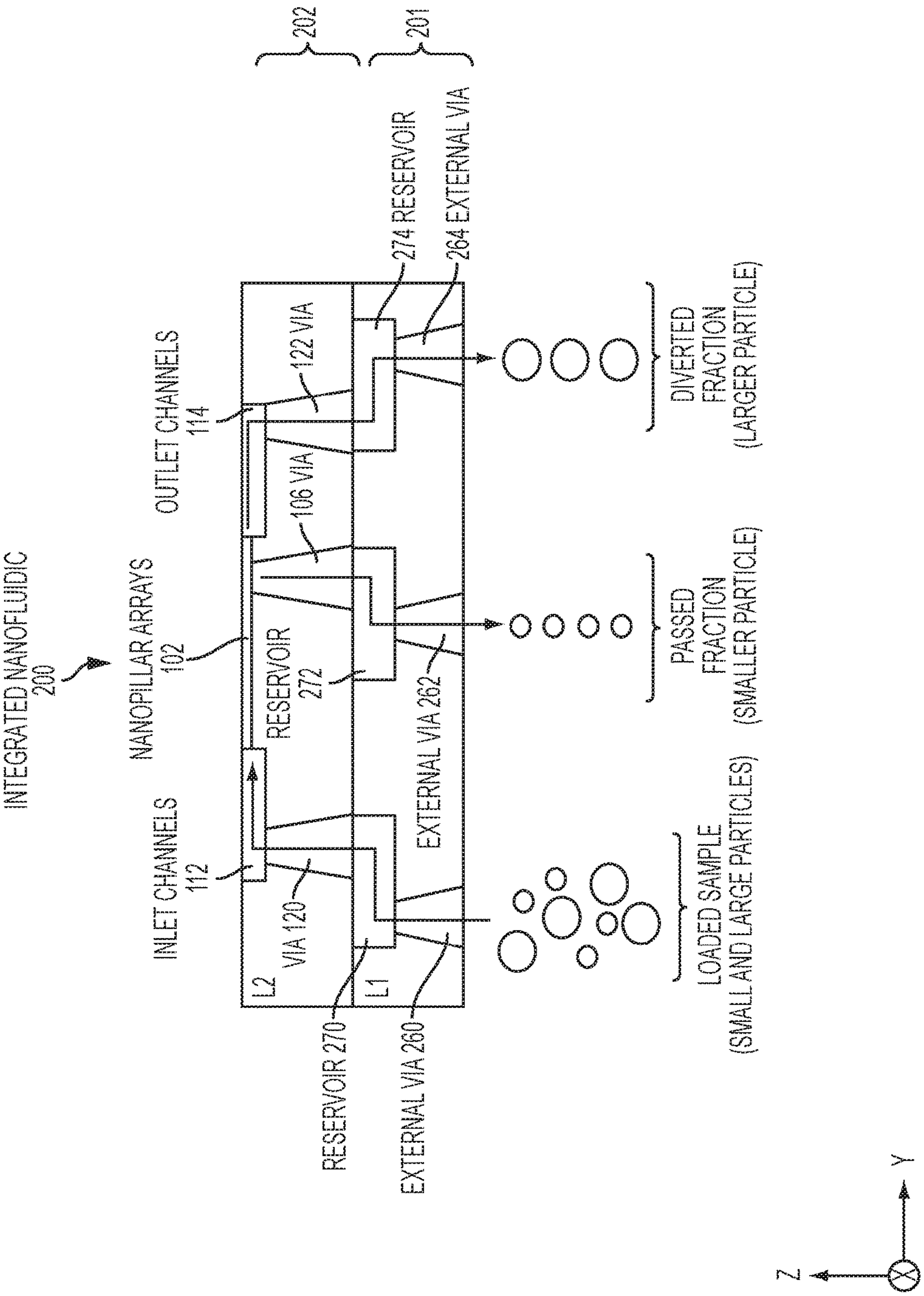
FIG. 2B is a simplified view of a cross-section of the integrated nanofluidic device according to an embodiment.

The operation of the integrated nanofluidic device 200 is inversely directed to the stacking order of loading layer 201 and the sorting layer 202. It is noted that the integrated nanofluidic device 200 (i.e., stacked chips) may be operated upside-down as well as right-side up. FIG. 2B is a simplified view of a cross-section of the integrated nanofluidic device 200 according to an embodiment. It should be appreciated that details for each of the nanopillar arrays 102, the inlet channels 112, and the outlet channels 114 are not depicted so as not to obscure the figure. FIG. 2B depicts a general flow of the fluid between the loading and sorting layers 201 and 202.

Sample fluid, e.g., having small and large particles, to be separated is loaded into the external via 260 of the loading layer 201. The sample fluid flows up into (sample loading) inlet channel reservoir 270 and up into inlet feed hole 120 of the sorting layer 202. From the inlet feed hole 120, the sample fluid flows through the inlet channels 112 (feed channels) into individual sorting elements 100 (i.e., individual nanopillar arrays 102). The sorting elements 100 separate the sample solution into two fractions, displaced/diverted (i.e., large particles) and passed (i.e., small particles), based on the particle size and the critical sorting size of the nanopillar arrays 102. The spatially separated fractions are diverted into separate outlet channels 108 and 110 (not shown in FIG. 2B). As can be seen, one of the benefits of the integrated nanofluidic device 200 is the ability to divert one of the outlet channels (e.g., the passed fraction outlet channels 108) back down to the loading layer 201 through via holes 106. The via holes 106 of the sorting layer 202 feed into the passed fraction reservoir 272 of the loading layer 201. This avoids the geometric impossibility of rejoining both of the individual fraction streams together on the same plane (i.e., both the diverted and the passed fraction streams on the sorting layer 202) without crossing streams. The other fraction (i.e., the diverted fraction) remains in the outlet channels 114 on the sorting layer 202. The diverted fraction flows through the outlet channels 114 and is directed into the diverted fraction outlet feed hole 122. From the diverted fraction outlet feed hole 122 on loading layer 201, the diverted fraction joins and accumulates into the diverted fraction reservoir 274 on the sorting layer 202 chip. In one implementation, sorting layer 201 may pass the diverted fraction to an external collector through the external via hole 264 in the oxide seal.

Figures 3A, 3B, 3C, 3D:
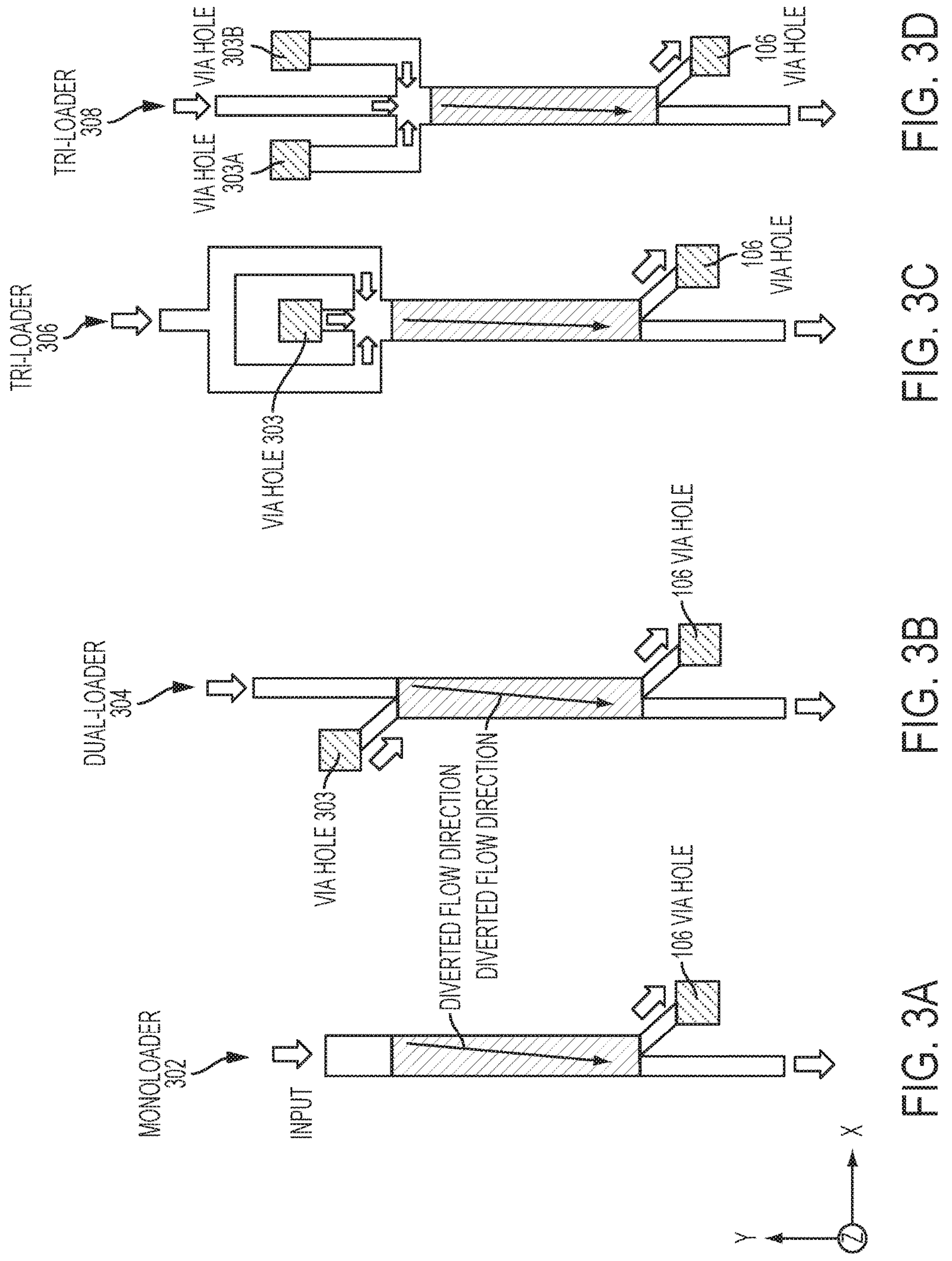
FIG. 3A is a schematic of a top-down view illustrating a monoloader as a sorting element according to an embodiment.
FIG. 3B is a schematic of a top-down view illustrating a dual-loader as a sorting element according to an embodiment
FIG. 3C is a schematic of a top-down view illustrating a ring tri-loader as a sorting element according to an embodiment.
FIG. 3D is a schematic of a top-down view illustrating a tri-loader as a sorting element according to an embodiment.

FIGS. 3A, 3B, 3C, 3D, and 3E illustrate different configurations of nanopillar arrays 102 according to an embodiment. Different configurations of nanopillar arrays 102 may be used, depending on sample requirements, capacity to be processed, and running time. According to an embodiment, FIG. 3A is a schematic of a single channel nanopillar array 102 with a single input and two outputs, termed a monoloader 302. The monoloader 302 may be considered the simplest nanopillar sorting device. The monoloader 302 has a low area footprint, and therefore can be packed densely. Also, the nanopillar array 102 may be stretched to any length across the chip to allow high volume capacity. The monoloader 302 may be used to concentrate a single particle sample, or to enrich a single particle within a multi-particle solution. Some of the unwanted particles may be able to cross into the enriched, displaced stream due to the full-width loading of the device.

According to an embodiment, FIG. 3B is a schematic of a single channel array with two inputs and two outputs, termed a dual-loader 304. The dual-load 304 allows complete separation of particles (e.g., small and large particles) in a multi-particle solution. The input particle stream is forced into a narrow jet by an input buffer stream from inlet via hole 303, resulting in a transition zone through which displaced particles can travel and separate from the sample jet. The sorted particles exit through one output, while the remaining particles flow out the other (via hole 106). For high density packing, at least one of the input and output feeds to the dual-loader 304 is to be an inlet via hole 303 from a loading layer reservoir 401 (as shown in FIGS. 4A and 4B).

According to an embedment, FIGS. 3A and 3B illustrate two configurations for tri-loaders 306 and 308. A tri-loader is a single channel array with three inputs and two outputs. FIG. 3C illustrates the tri-loader 306 constructed with a ring-feed for the buffer solution in one implementation.

FIG. 3D illustrates the tri-loader 308 constructed with three independently fed inputs in another implementation. The tri-loader 308 may be used to prepare a narrow jet of particles using two jacketing buffer streams in FIG. 3D. A narrowing input particle jet allows a greater level of resolution for separation between particles of different sizes. The monoloader 302, dual-loader 304, tri-loader 306, and tri-loader 308 are each a sorting element.

Figure 3E:
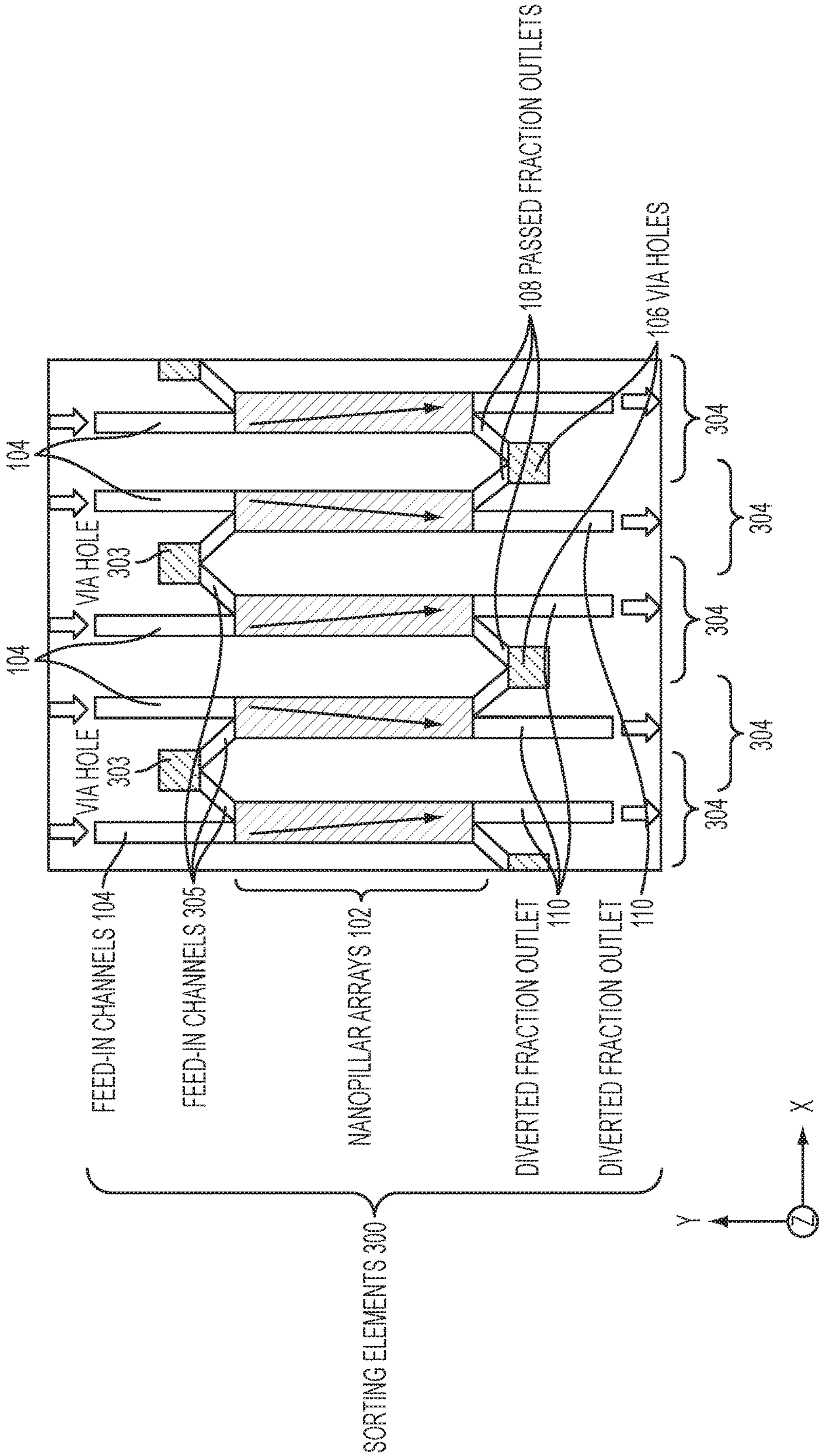
FIG. 3E is a partial view of parallel dual-loaders as the sorting elements according to an embodiment.

FIG. 3E is a partial view of a schematic of parallel dual-loaders 304 as the sorting elements 300 according to an embodiment. The parallel dual-loaders 304 have linked inputs, such as linked feed-in inlet via holes 303 for outputting fluid through feed-in channels 305. Also, the parallel dual-loaders 304 have linked outputs, such as linked diverted fraction outlet channels 110 and linked passed fraction via holes. The parallel dual-loaders 304 allow for increased packing of nanopillar arrays 102.

According to an embodiment, FIG. 4A is a schematic of a single bank 450 of dual-loaders 304 (as interconnected sorting elements 300) interlinked to operate in parallel, in which their nanopillar arrays 102 simultaneously (i.e., in parallel) process fluid from inlet channel 112 that feeds into feed-in channels 104 and process fluid from inlet via holes 303 that feeds into feed-in channels 305. The diverted fractions (i.e., larger particles affected by the critical angle of the nanopillar arrays 102) flow to the outlet channel 114 through diverted fraction outlets 110. Conversely, the passed fractions (i.e., smaller particles not affected by the critical angle of the nanopillar arrays 102) flow to the via holes 106 through passed fraction outlets 108. The bank 150 of interlinked dual-loaders 304 (as interconnected sorting elements 300) allows for parallel processing of a larger amount of fluid (having particles to be sorted) than a single sorting element.

According to an embodiment, FIG. 4B is a schematic of an integrated nanofluidic device 400 having a two layer stack of chips, which are the microfluidic loading/unloading layer 401 and the nanofluidic sorting layer 402. The loading and unloading layer 401 is designed for loading in the fluid containing the sample and for collecting the fluid having the sample sorted by the nanopillar arrays 102 in the banks 450. In FIG. 4B, the integrated nanofluidic device 400 is formed by stacking the sorting layer 402 (chip) on top of the loading layer 401, such that fluid may flow between the loading layer 401 and the sorting layer 402 as discussed herein.

The loading layer 401 includes the (sample loading) inlet channel reservoir 270 that directly interfaces through an external via hole 260 to an external drive pump. The external via hole 260 allows outside connection to the integrated nanofluidic device 400 (as discussed in FIGS. 1 and 2).

Liquid sample can flow through the (sample loading) inlet channel reservoir 270 to the sorting chip layer 402 through via hole 120. The dashed hole 120 shows the location in the loading layer 401 that coincides to the inlet feed hole 120 in the sorting layer 202, so as to allow fluid to flow. A network of branching inlet channels 112 extends from the inlet feed hole 120 out to banks 450 of dual-loaders 304 fabricated in the sorting layer 402.

The loading layer 401 includes passed fraction outlet channels 276, and each of the passed fraction outlet channels 276 is aligned to (i.e., underneath) via holes 106 in a row of banks 450 (on the sorting layer 402), such that the passed fraction outlet channels 276 receive the passed fractions (e.g., smaller particles). The passed fractions are collected in the passed fraction reservoir 272, and an external via 262 may be utilized to extract the passed fractions from the passed fraction reservoir 272 using, e.g., a vacuum or negative pressure. In FIG. 4B, four horizontal passed fraction outlet channels 276 are formed in the loading layer 401 with holes (not shown so as not to obscure the figure) that coincide with each of the via holes 106 in the four rows of banks 450. Accordingly, the number of horizontal passed fraction outlet channels 276 is designed to match the number of rows of bank 450.

The loading layer 401 includes diverted fraction outlet channel reservoir 274, and the diverted fraction outlet channel reservoir 274 is open at the diverted fraction outlet feed hole 122 of the sorting layer 402. The diverted fraction reservoir 274 is designed to receive the diverted fraction (e.g., larger particles) output down from the outlet channels 114 via the diverted fraction outlet feed hole 122.

Additionally, loading layer 401 includes four horizontal inlet via channels 460, and each of the inlet via channels 460 is aligned to (i.e., underneath) inlet via holes 303 in a row of banks 450 (on the sorting layer 402), such that the inlet channels 460 input fluid (e.g., buffer) up into the inlet via holes 303. The fluid from the inlet via channels 460 is passed into the feed-in channels 305 to be processed by the nanopillar arrays 102. In FIG. 4B, four horizontal inlet via channels 460 are formed in the loading layer 401 with holes (not shown so as not to obscure the figure) that coincide with each of the inlet via holes 303 in the four rows of banks 450. The inlet via channels 460 are supplied with fluid from inlet vias reservoir 462. An external via hole 464 allows outside connection to the inlet vias reservoir 462 to supply fluid.

The loading layer 401 includes diverted fraction outlet channel reservoir 274, and the diverted fraction reservoir 274 is open at the diverted fraction outlet feed hole 122 of the sorting layer 202. The diverted fraction reservoir 274 is designed to receive the diverted fractions (e.g., larger particles) from the outlet channels 114 via the diverted fraction outlet feed hole 122 of the sorting layer 402.

In accordance with embodiments, it should be appreciated that arrays with higher numbers of inputs and outputs can be constructed. However, increasing the number of input streams increases the area footprint of a single sorting device, thereby decreasing the packing density. Multiple, sequential outputs can be desirable if more than a single particle is to be sorted out in a single sorting device. Each output can be routed through a different feed/via and collected in the loading layer according to embodiments.

Figure 8A:
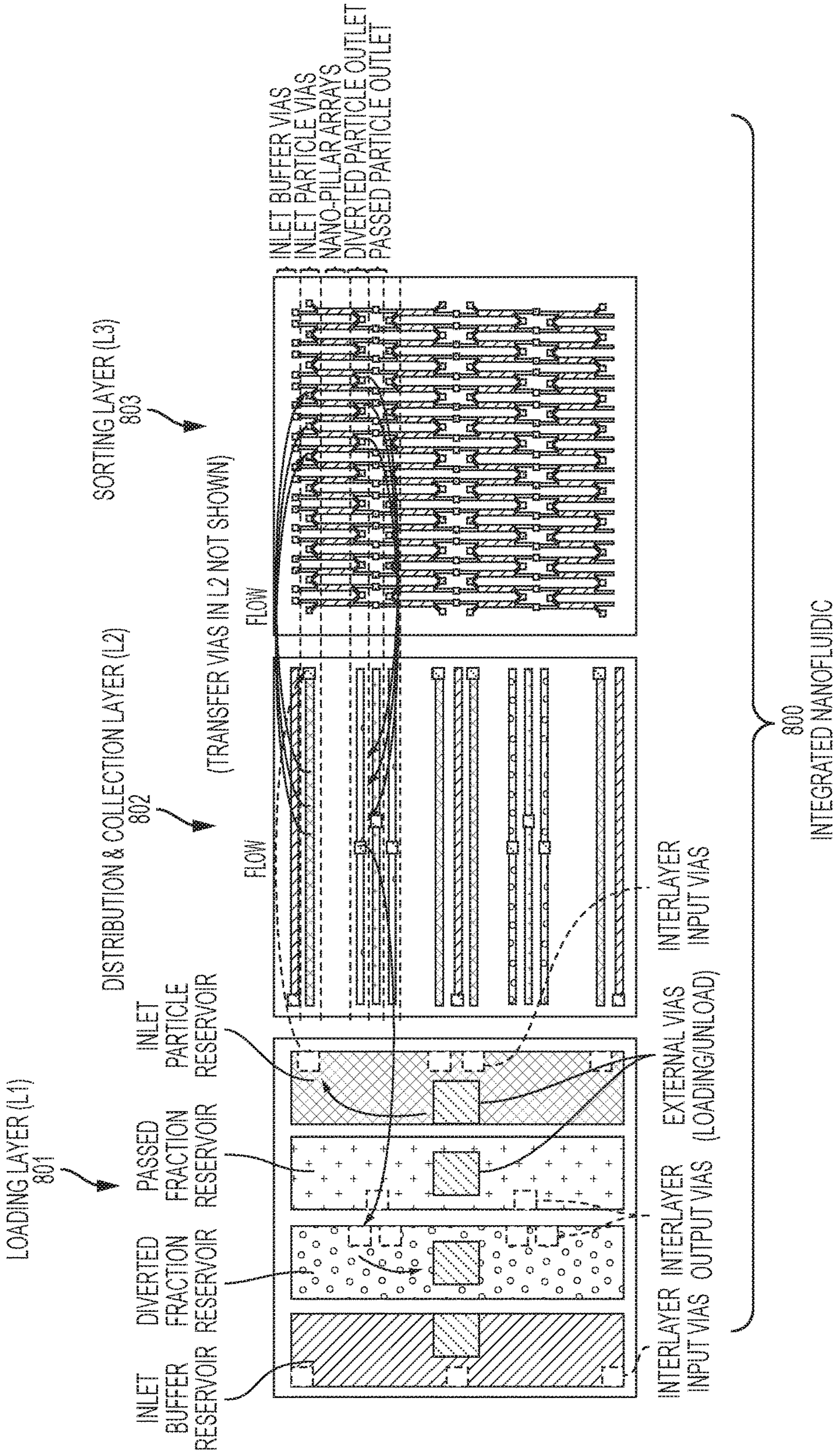
FIG. 8A is a schematic of a three layer integrated nanofluidic device according to another embodiment.
Figure 8B:
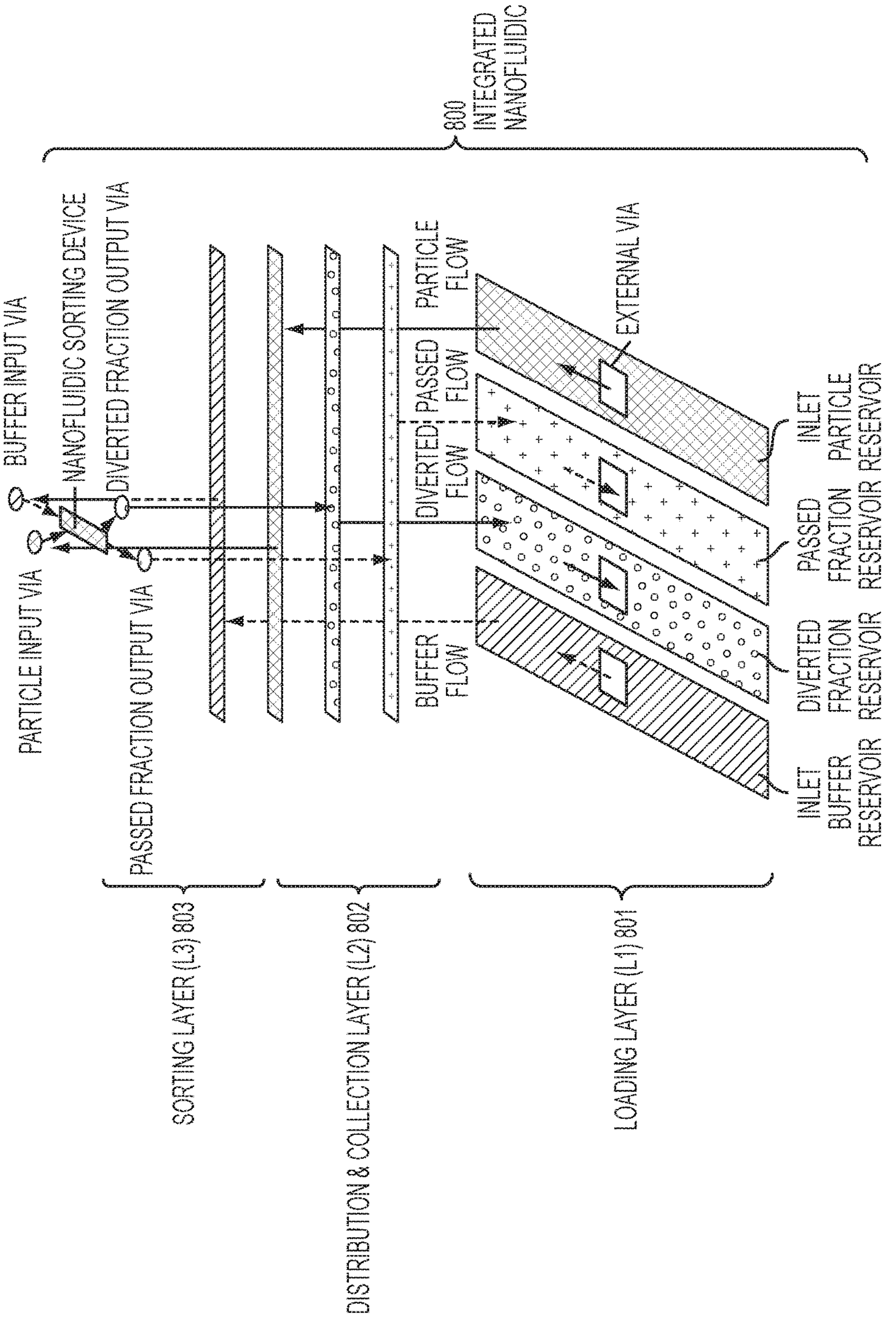
FIG. 8B is a flow schematic illustrating the direction of each fluid sample according to the other embodiment.

Several modifications of the integrated nanofluidic devices 200, 400 can be made. For example, additional reservoirs may be added by adding additional microfluidic chips into the stack. Larger reservoirs can be fed, through via holes in the chip, into smaller reservoirs, and this allows a more precise spatial distribution of sample to the required nanofluidic devices on upper sorting layers. An example of this is shown in FIGS. 8A and 8B. FIGS. 8A and 8B illustrate a schematic of a three layer integrated nanofluidic device 800 with linked dual-loader sorting elements. In this design, the sorting layer (L3) 803 is composed of banks of dual-loaders, with their input and output feeds all connected by via holes to smaller reservoirs in an intermediate layer (distribution & collection layer L2) 802. This intermediate layer 802 is then fed through vias by larger reservoirs in the loading layer (L1) 801. FIG. 8B is a flow schematic illustrating the direction of each fluid sample as the fluid traverses the chip stack during operation.

Figure 9A:
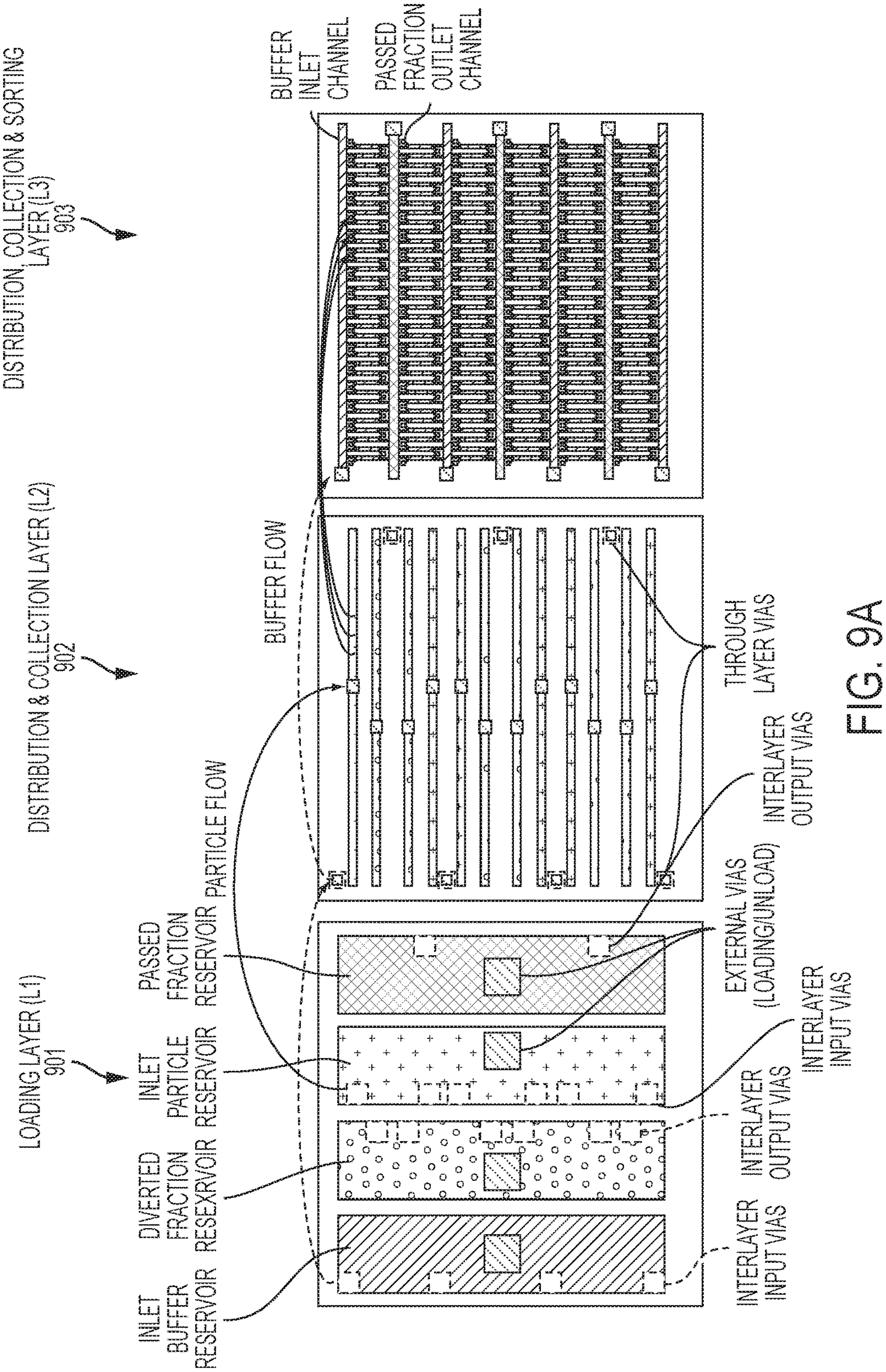
FIG. 9A is a schematic of a three layer integrated nanofluidic device according to yet another embodiment.
Figure 9B:
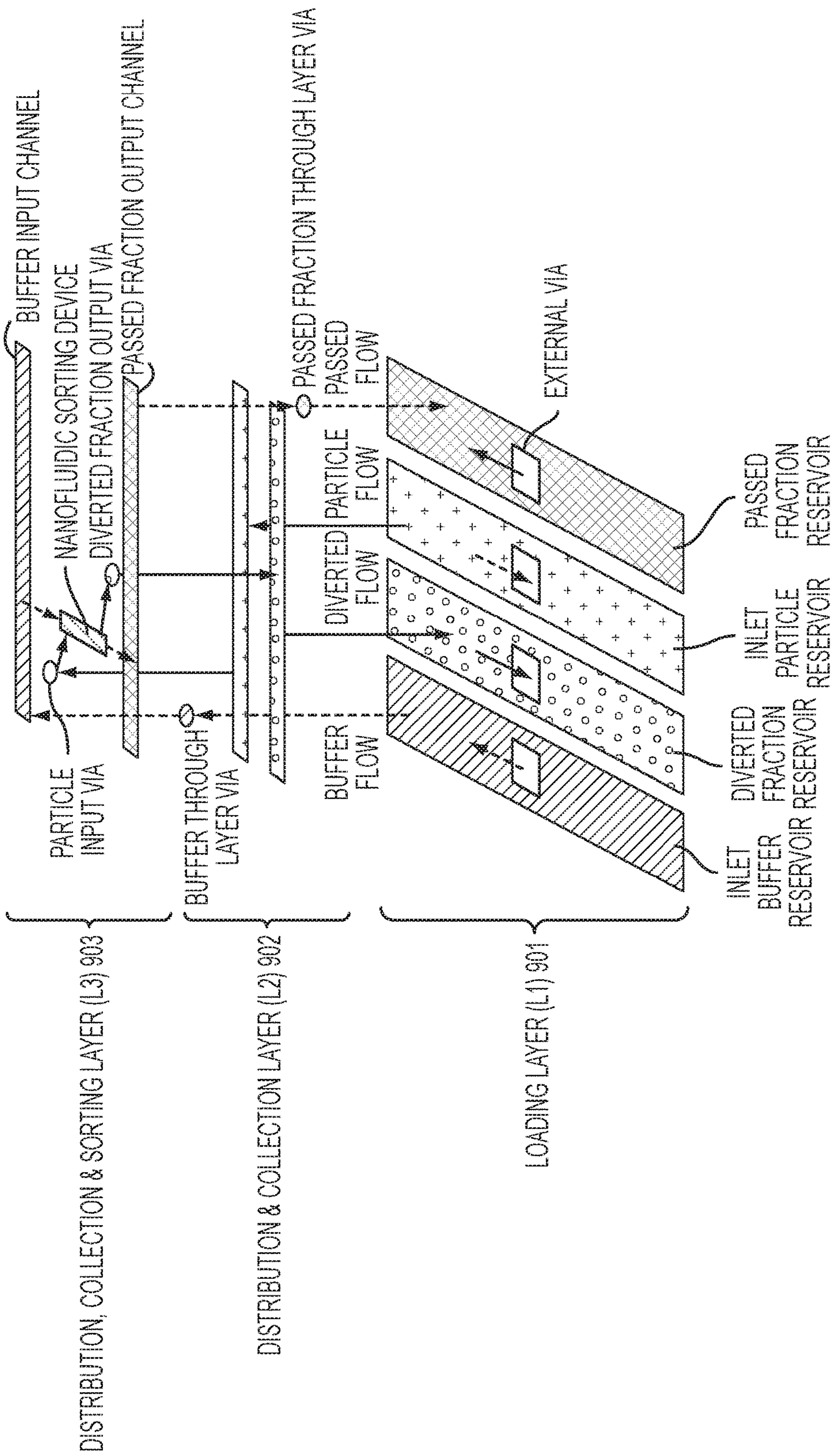
FIG. 9B is a flow schematic illustrating the direction of each fluid sample according to the other embodiment.

A further example is shown in FIGS. 9A and 9B, using a three layer integrated nanofluidic device 900. FIGS. 9A and 9B illustrate a schematic of integrated nanofluidic device 900 in which a combination of reservoirs and via holes on all three levels 901, 902, 903 feed linked dual-loader sorting elements. The flow schematic in FIG. 9B shows the direction of each fluid sample as it traverses the chip stack during operation. Also, multiple reservoirs may be added per layer and within multiple layers. As such, the multiple reservoirs may provide auxiliary solutions, such as buffers, labeling reagents, lysing solutions, etc., which can be directed into sorting layers as required.

Additional sorting layers can be added, so that multiple stage sorting can be achieved in one integrated nanofluidic device. For example, the collected diverted fraction of one sorting layer can be directed up to a second chip where collected diverted fraction is redistributed into a second bank of nanopillar arrays, thereby allowing a two-step sorting process. Alternatively, the output of each nanopillar array may be directly fed up to nanopillar arrays on a second sorting layer. This is particularly useful when considering the process flow of a typical sorting operation, in which larger objects (e.g., cells, debris, dust) are to be sorted out of a sample first before sorting smaller objects (e.g., organelles, ribosomes, DNA, vesicles, proteins). In this manner, a larger micro-scale sorting array on one layer can feed directly up into several nanoscale sorting arrays on a second level. Multiple fluid fractions can also be diverted to adjacent layers in the stack, allowing different fractions to be collected in multiple reservoirs for collection or disposal. The number of sorting levels can be increased as desired according to embodiments, and the limiting factor is the ability to maintain fluid flow against the increasing hydrodynamic resistance of the complete device network.

Embodiments may be coupled with an encasement or housing, termed a fluid cell, to allow interfacing to the external world. The function of the fluidic cell is to allow connections between macroscopic sources (e.g. pumps, reservoirs, computers, etch) and the chips input/outputs. These connections allow fluid (sample), electrical signals, optical signals, etc. to be relayed to and from the chip and measured. The chip and fluid cell together are termed a unit. Several methods can be used to drive the fluid flow into the unit, and a few examples include: external pumps, electrophoresis, on-chip electric fields, on-chip oscillators or membranes, direct capillary wetting, chemo-capillary drive, triggered changes in surface tensions, magnetic fields, etc. These drive mechanisms can be incorporated into the basic unit, or into an external housing or control unit.

According to an embodiment, multiple fluids (samples, particles, analytes, etc.) may be processed in parallel on-chip as depicted in FIG. 5. FIG. 5 is a schematic of an integrated nanofluidic device 500 having the two layer stack of chips, which are the microfluidic loading/unloading layer 501 and the nanofluidic sorting layer 502.

Multiple inlet channel reservoirs 562A, 562B, 562C, 562D, 562E in the loading layer 501, each connected to an external source (by their respective external via holes 260) with a different fluid/analyte, can be loaded in parallel. Each fluid can be channeled into different banks 450 of nanopillar arrays 102, allowing simultaneous processing. Mixing between different analyte solutions can be facilitated with connecting junctions, either at the loading layer 501 or sorting layer 502.

As an example of supplying fluid back and forth to the upper bank 450, fluid may be input into the inlet channel reservoir 562A on the loading layer 501, and the inlet via 580 connected to inlet channel 112A receives the fluid in the sorting layer 502. The fluid passes through inlet channel 112A and is distributed to the nanopillar arrays 102 connected to the inlet channel 112A in the bank 450. Additionally, each nanopillar array 102 receives fluid in its respective inlet via hole 303 from the aligned inlet via channel 460, and the inlet via channels 460 are connected to an inlet vias reservoir 462 to receive fluid through external via 464. After sorting the samples in the received fluid by the nanopillar arrays 102 in the upper bank 450, each nanopillar array 102 supplies its passed fraction (e.g., smaller particles) through its passed fraction outlet via holes 106 to the upper passed fraction outlet channel 276 (that is aligned to the upper bank 450). The upper passed fraction outlet channel 276 supplies the passed fraction to the passed fraction outlet vias reservoir 272 for collection through the external via 262. Similarly, after sorting the samples in the received fluid by the nanopillar arrays 102 in the upper bank 450, each nanopillar array 102 supplies its diverted fraction its outlet channel 114A. The outlet channel 114A is connected to its outlet feed 582 to supply the diverted fraction to corresponding diverted fraction outlet channel reservoir 274A, such that the collection of diverted fraction can be extracted through the corresponding external via 264.

Unlike the integrated nanofluidic devices 200 and 400, the integrated nanofluidic device 500 has four independent banks 450 of nanopillar arrays 102, and each bank 450 can separately receive, process, and output fluid. In FIG. 5, the inlet channel reservoirs 562A, 562B, 562C, 562D, 562E in the loading layer 501 are respectively connected to inlet channels 112A, 112B, 112C, 112D, 112E on the sorting layer 502 through inlet holes 580, such that fluid can be independently supplied from inlet channel reservoirs 562A-562E to inlet channels 112A-112E. Similarly, the diverted fraction outlet channel reservoirs 274A, 274B, 274C, 274D, 274E in the loading layer 501 are respectively connected to outlet channels 114A, 114B, 114C, 114D, 114E on the sorting layer 502 through respective inlet holes 582, such that fluid (i.e., diverted fraction) can be independently supplied from outlet channels 114A-114E to respective diverted fraction outlet channel reservoirs 274A-274E. As discussed herein, the horizontal inlet vias channels 460 are each respectively aligned to a row of inlet via holes 303 for each bank 405, such that fluid is input from the inlet vias reservoir 462 to all of the rows of inlet via holes 303. Also, the horizontal passed fraction outlet channels 276 are each respectively aligned to a row of outlet via holes 106 for each bank 450, such that fluid (i.e., passed fraction) from all of the rows of outlet via holes 106 in input to the passed fraction outlet vias reservoir 272.

The number of analytes is unbounded, depending only on the limits of device density (e.g., for a chip with 1000 rows of independent banks (devices), 1000 independent analytes could be loaded and processed at once). Loading of each analyte can proceed in several ways; a single external connection (e.g., tube, syringe, pipet, capsule, etc.) can be connected to the loading layer 501 directly, giving a one-to-one analyte/input relation. In cases where this is spatially unfeasible due to overcrowding of connections, a single or set of connections (e.g., tubes, nozzles) can be made to scan and load each diverted fraction reservoir 274A-274E in sequence.

Different analytes are loaded into the connections by way of a set of macroscopic, external valves and pumps/drivers that sequentially inject, purge, clean, and reinject new analytes into the connection for loading onto chip. The inputs and outputs coming from the basic unit, such as fluid flow rates, sample content, electrical signals etc., may be read to determine the state of the integrated nanofluidic device and the degree of operation. This is may be particularly true with a high density integration of fluidic devices, in which control of driving forces and monitoring of output flow rate are utilized for successful separation.

It should be appreciated that embodiments may also encompass a reader device to monitor the inputs/outputs of the basic unit (i.e., the integrated nanofluidic device). The reader device can include instruments necessary for monitoring the state of the fluid and its flow, to count the sample particles coming into and out of the basic unit, e.g. by optical detection (direct imaging, fluorescence, absorbance, two-photon excitation, etc.), electrical detection (capacitance, piezoelectric, etc.), magnetic fields, radioactivity, etc., or to register any electrical signals generated on-chip. In an embodiment, a chip may include a glass coverslip so that the entire bank of nanofluidic devices can be imaged directly by bright field or fluorescence microscopy, to inspect the particle flow (fluid velocity) in situ. An automated, electronic camera and computer system can be used to scan and interpret the state each array, allowing quality control and real-time monitoring of the separation process. In this embodiment example, the reader may include the basic unit (e.g., the integrated nanofluidic device) plus the camera, computer, and any auxiliary components or housing necessary to operate the ensemble.

The nature of the sample to be sorted generally dictates the required sizes of the channel widths and nanopillar arrays. Chemical modification of the surfaces within each layer is generally performed, as most colloids and molecules, in particular biological materials, will adsorb and clog on the bare silica surfaces. Surface modification can include deposition of materials prior to sealing of the stack, formation of ionic complexes between the charged silica surface and appropriate charged particles, adsorption of small molecules or polymers to form a physisorbed surface layer, and/or chemical bonding (i.e. through siloxane linkages) organic or inorganic molecules to the silica surface. Chemical modification can be performed after the stack has been bonded (i.e., after the loading and sorting layers have been bonded together). Deposition of thin layers of material, in particular metals or oxides, on the surfaces of an individual layer allows unique functionalization of a particular layer, such as, e.g., a loading layer with a platinum surface coating modified by a hydrosilanes or thiol monolayer, feeding into a sorting layer with a silica surface modified by a halosilane monolayer. This affords the ability to customize the chemical environment of each layer to allow optimized sorting conditions.

Embodiments may be utilized in various applications. Some of the applications for embodiments may include purification, extraction, concentration, enrichment, and diagnostics. Purification is the removal of a particle(s) from the main sample stream. The nanopillar arrays are designed to selectively displace the particle(s) to be removed, and the passed particles are collected. Extraction is the sorting out and collection of a desired particle(s) from the main sample stream. The nanopillar array displaces the desired particles, which are collected in a separate reservoir. Concentration is the use of the nanopillars to displace the particles from a wide stream into a narrow stream, effectively increasing the particle density.

Enrichment is the same as concentration; however, the input particle stream contains particles that do not displace, and thus the density of the desired particle increases with respect to the unsorted ones. Diagnostics involve the detection of a particular particle by tracking whether it sorts in nanopillar arrays. The desired particle can be displaced, and the resultant sorted stream detected using fluorescence, electrical detection, visual inspection, etc. Alternatively, undesirable particles can be displaced, and the passed stream of desired particles read in the same manner. Purification, extraction, concentration, and enrichment are predominately preparative applications, which require sufficient volumes of sample to be processed and collected from the chip. Diagnostics can be done on-chip or off-chip, depending on the application, and do not require large volumes to be processed.

It should be recognized that embodiments provide structures and techniques for the integration of large numbers of nanopillar sorting arrays into a single integrated nanofluidic device using multilayer bonded chip stacks. The resultant integrated nanofluidic device is configured to sort liquid samples consisting of various sized particles into constituent aliquots of individual particle sizes.

Samples may be biological such as, e.g., DNA, RNA, polysaccharides, protein complexes, viruses, vesicles, liposomes, exosomes, platelets, organelles, spores, cells, etc. Also, the sample may be material/chemical, such as, e.g., synthetic colloids, nanowires, polymers, and/or crystallites. An integrated nanofluidic device includes a base microfluidic chip (i.e., loading layer) with a large reservoir into which sample is loaded, and a second chip (i.e., sorting layer) bonded on to the microfluidic layer, wherein the second chip comprises banks of nanopillar sorting arrays linked to the microfluidic reservoir by via holes etched through the chips. Liquid sample is then forced up onto the nanopillar arrays where liquid sample is separated into sorted and unsorted particle output streams.

In embodiments, a particular aspect is the ability to direct an output stream to an adjacent layer in the chip stack (either up or down), thereby removing the geometric constraint on interlinking all of one type of output stream within the plane of a single chip. This allows large banks of parallel sorting arrays to simultaneous operate and recombine their output streams into a final reservoir from so that liquid in the final reservoir can be collected in a practical manner (e.g., pipetting, centrifugation, blotting, capillary, etc.). Accordingly, embodiments provide a practical means to use nanopillar arrays for separating larger quantities of liquid sample through distributed processing.

It is noted that nanopillar arrays have been discussed as an example type of sorting array for illustration purposes. It should be appreciated that the sorting arrays are not limited to nanopillar sorting arrays and other types of sorting arrays may be utilized according to embodiments.

In practice, the area of the integrated nanofluidic device can be scaled to practical limits of silicon lithography nanotechnology. For example, 8" (inch) wafer sized chip sets can be fabricated and bonded with current manufacturing capabilities, allowing large scale fabrication of high density, high through-put integrated nanofluidic sorting devices. This means devices ranging from hundreds of microns, to millimeters, up to 10's of centimeters can be readily produced. For a packing density of ~500 devices/$cm^2$, processing at a practical flow rate of 1 $nL \cdot s^{-1}$, this implies a 1 $cm^2$ device can process ~1-2 milliliters per hour ($mL \cdot h^{-1}$). For a typical layout on an 8" silicon wafer yielding approximately 50 $cm^2$, this implies a capacity of ~100 $mL \cdot h^{-1}$.

Figure 10:
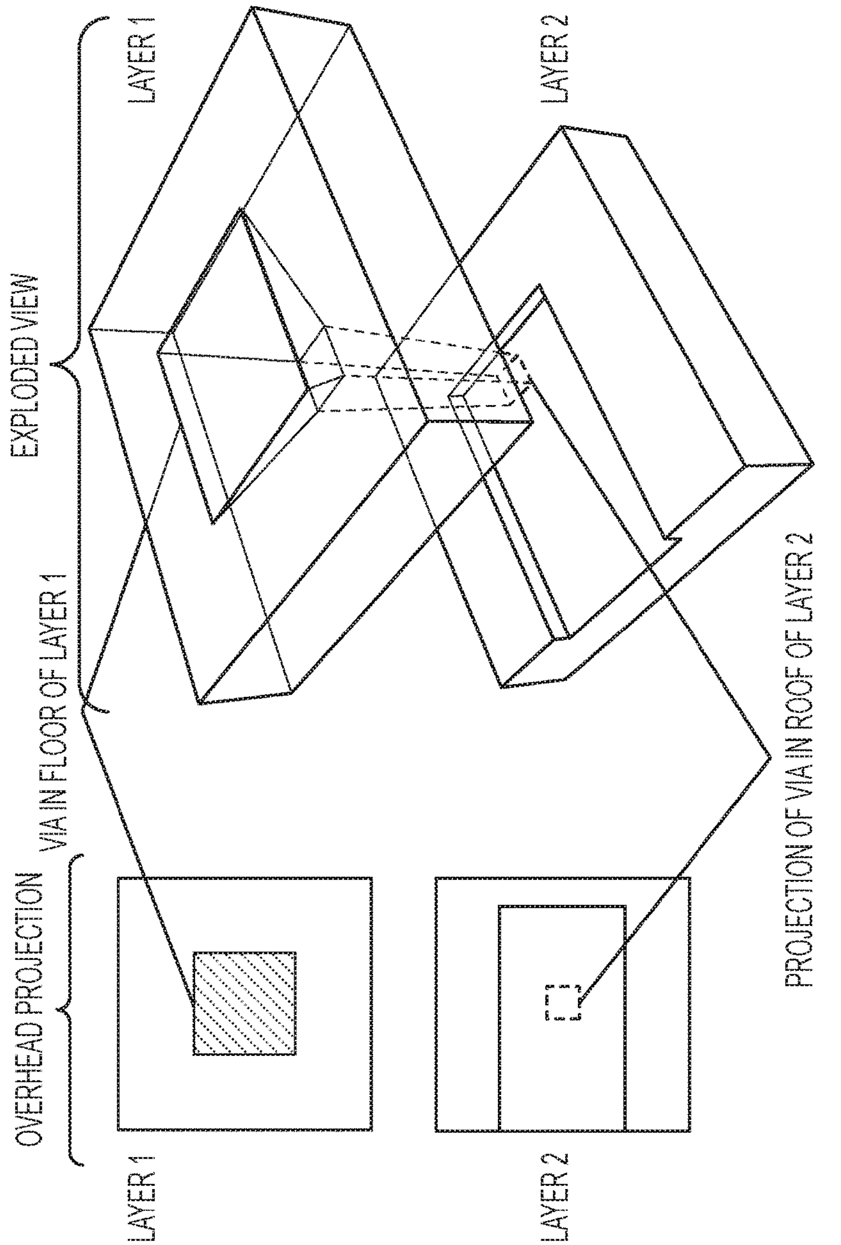
FIG. 10 is a schematic of an example via hole that is utilized to connect fluidics between two silicon chip layers according to an embodiment.

FIG. 10 shows a schematic view of an example via hole may be used to connect fluidics between two silicon chip layers according to an embodiment. FIG. 10 illustrates an overhead projection of the through via in layers 1 and 2, along with an exploded view of the through via. A through via is etched such that a fluidic space on the top surface of the chip (layer 1 in this case) is connected to a second space on a chip below (layer 2). The via hole sits in the roof of layer 2, formed by the backside of layer 1. Vias provide the communication between fluidic networks on different chips and allow the reduction in geometry necessary for high density nanopillar sorting arrays. The schematic icons used to illustrate embodiments are matched to the geometry of the vias in FIG. 10. Although two layers are shown with a single through via, it should be appreciated that the more layers and more through vias may be utilized.

Figure 6:
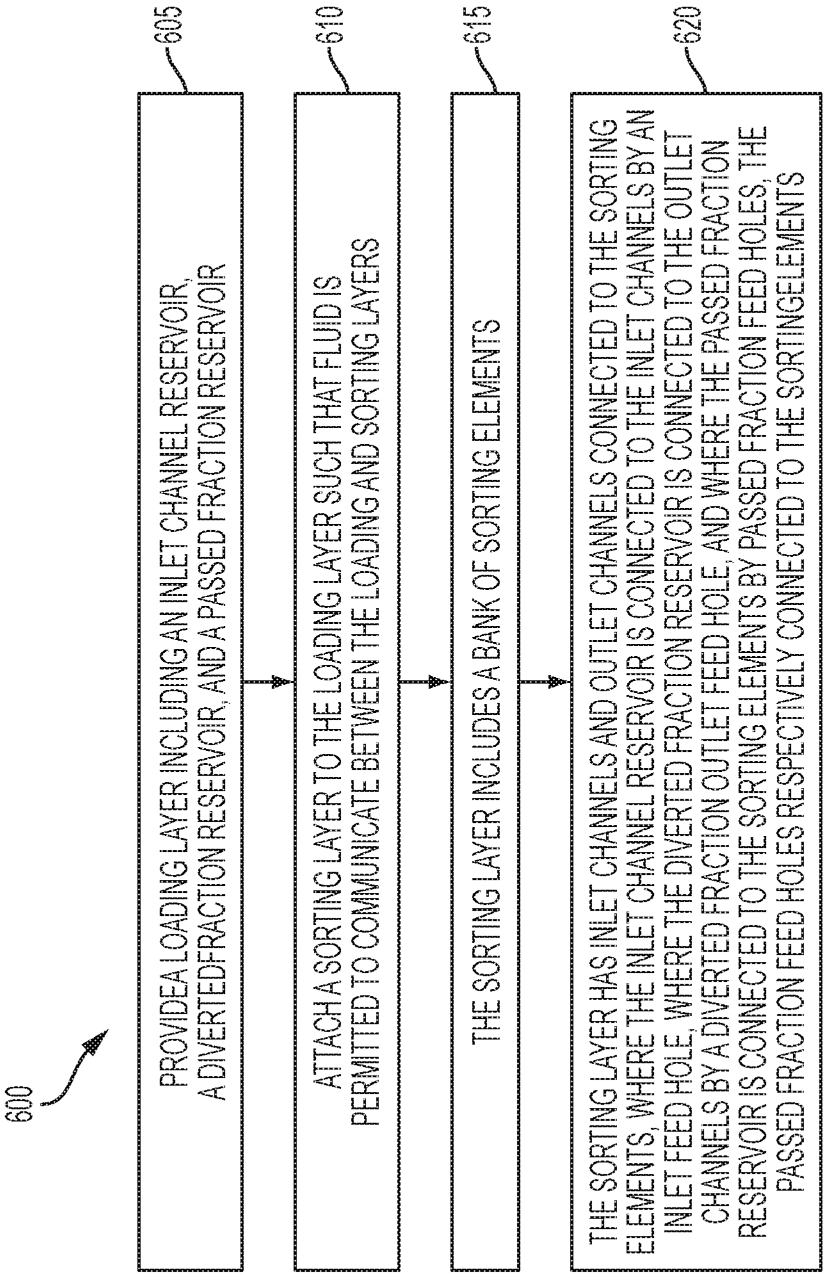
FIG. 6 is a flow chart of a method of configuring an integrated nanofluidic device according to an embodiment.

FIG. 6 is a flow chart 600 of a method of configuring an integrated nanofluidic device 200 according to an embodiment.

At block 605, a loading layer 201 includes a (sample loading) inlet channel reservoir 270, a diverted fraction reservoir 274, and a passed fraction reservoir 272 as depicted in FIG. 2A.

At block 610, a sorting layer 202 is attached to the loading layer 201 such that fluid is permitted to communicate between the loading and sorting layers.

At block 615, the sorting layer 202 includes a bank 150 of sorting elements 100.

At block 620, the sorting layer 202 has inlet channels 112 and outlet channels 114 connected to the sorting elements, where the (sample loading) inlet channel reservoir 270 is connected to the inlet channels 112 by an inlet feed hole 120, where the diverted fraction reservoir 274 is connected to the outlet channels 114 by a diverted fraction outlet feed hole 122, and where the passed fraction reservoir 272 is connected to the sorting elements 100 by passed fraction feed holes 106, and the passed fraction feed holes 106 are respectively connected to the sorting elements 100.

Figure 7:
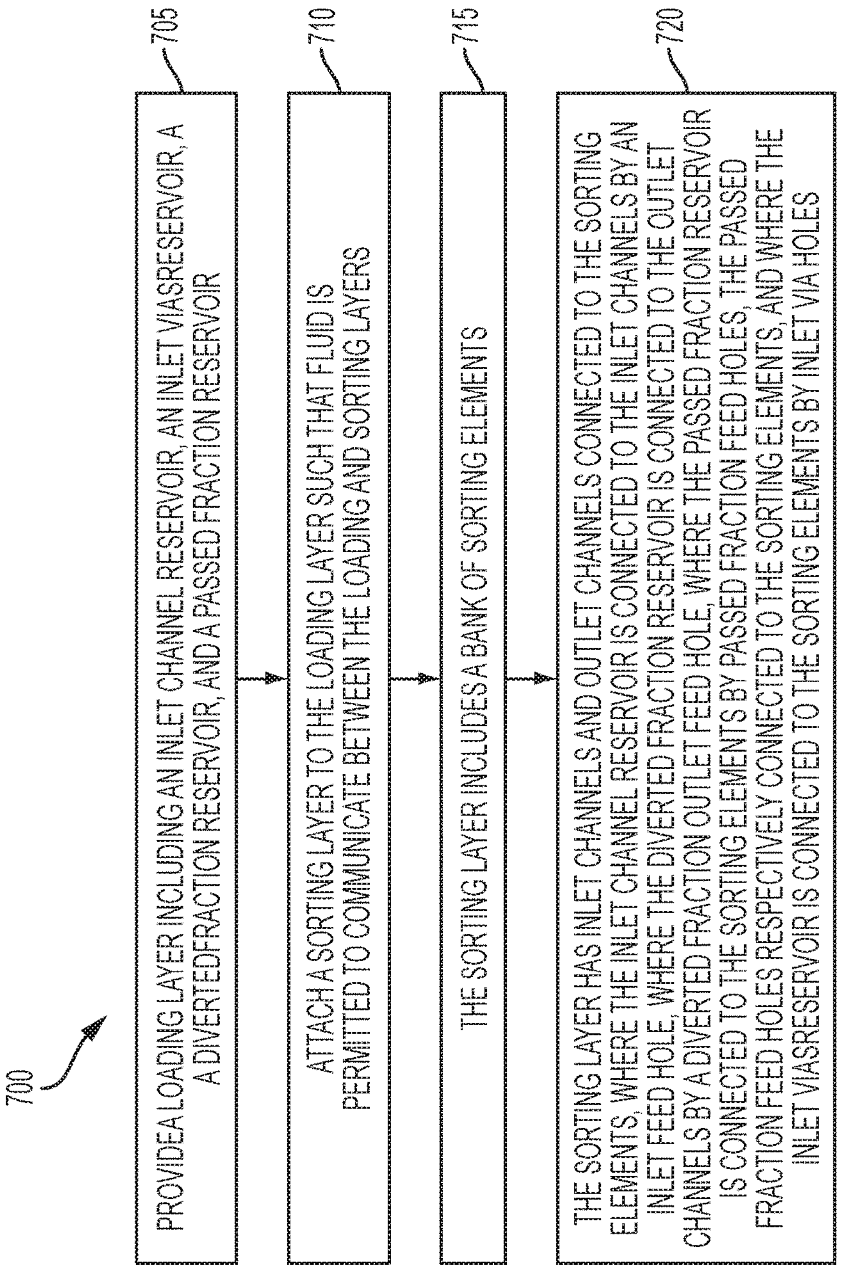
FIG. 7 is a flow chart of a method of configuring an integrated nanofluidic device according to another embodiment.

FIG. 7 is a flow chart 700 of a method of configuring an integrated nanofluidic device 400 according to an embodiment.

At block 705, a loading layer 401 includes a (sample loading) inlet channel reservoir 270, an inlet vias reservoir 462, a diverted fraction reservoir 274, and a passed fraction reservoir 272.

At block 710, a sorting layer 402 is attached to the loading layer 401 such that fluid is permitted to communicate between the loading and sorting layers.

At block 715, the sorting layer 402 includes a bank 150 of sorting elements (e.g., such as the dual-loader 304).

At block 720, the sorting layer 402 has inlet channels 112 and outlet channels 114 connected to the sorting elements, where the (sample loading) inlet channel reservoir 270 is connected to the inlet channels 112 by an inlet feed hole 120, where the diverted fraction reservoir 274 is connected to the outlet channels 114 by a diverted fraction outlet feed hole 122, where the passed fraction reservoir 272 is connected to the sorting elements by passed fraction feed holes 106, the passed fraction feed holes 106 respectively connected to the sorting elements, and where the inlet vias reservoir 462 is connected to the sorting elements by inlet via holes 303.

It will be noted that various microelectronic device fabrication methods may be utilized to fabricate the components/elements discussed herein as understood by one skilled in the art. In semiconductor device fabrication, the various processing steps fall into four general categories: deposition, removal, patterning, and modification of electrical properties.

Deposition is any process that grows, coats, or otherwise transfers a material onto the wafer. Available technologies include physical vapor deposition (PVD), chemical vapor deposition (CVD), electrochemical deposition (ECD), molecular beam epitaxy (MBE) and more recently, atomic layer deposition (ALD) among others.

Removal is any process that removes material from the wafer: examples include etch processes (either wet or dry), and chemical-mechanical planarization (CMP), etc.

Patterning is the shaping or altering of deposited materials, and is generally referred to as lithography. For example, in conventional lithography, the wafer is coated with a chemical called a photoresist; then, a machine called a stepper focuses, aligns, and moves a mask, exposing select portions of the wafer below to short wavelength light; the exposed regions are washed away by a developer solution. After etching or other processing, the remaining photoresist is removed. Patterning also includes electron-beam lithography.

Modification of electrical properties may include doping, such as doping transistor sources and drains, generally by diffusion and/or by ion implantation. These doping processes are followed by furnace annealing or by rapid thermal annealing (RTA). Annealing serves to activate the implanted dopants.

The flowchart and block diagrams in the Figures illustrate the architecture, functionality, and operation of possible implementations of systems, methods, and computer program products according to various embodiments of the present invention. In this regard, each block in the flowchart or block diagrams may represent a module, segment, or portion of instructions, which comprises one or more executable instructions for implementing the specified logical function(s). In some alternative implementations, the functions noted in the block may occur out of the order noted in the figures. For example, two blocks shown in succession may, in fact, be executed substantially concurrently, or the blocks may sometimes be executed in the reverse order, depending upon the functionality involved. It will also be noted that each block of the block diagrams and/or flowchart illustration, and combinations of blocks in the block diagrams and/or flowchart illustration, can be implemented by special purpose hardware-based systems that perform the specified functions or acts or carry out combinations of special purpose hardware and computer instructions.

The descriptions of the various embodiments of the present invention have been presented for purposes of illustration, but are not intended to be exhaustive or limited to the embodiments disclosed. Many modifications and variations will be apparent to those of ordinary skill in the art without departing from the scope and spirit of the described embodiments. The terminology used herein was chosen to best explain the principles of the embodiments, the practical application or technical improvement over technologies found in the marketplace, or to enable others of ordinary skill in the art to understand the embodiments disclosed herein.

What is claimed is:

1. An integrated nanofluidic device comprising:

a loading layer including an inlet channel reservoir, an inlet vias reservoir, a diverted fraction reservoir, and a passed fraction reservoir; and a sorting layer attached to the loading layer such that fluid is permitted to communicate between the loading and sorting layers, the sorting layer including a bank of sorting elements, wherein the sorting layer has inlet channels and outlet channels connected to the sorting elements, wherein the inlet channel reservoir is connected to the inlet channels by an inlet feed hole, wherein the diverted fraction reservoir is connected to the outlet channels by a diverted fraction outlet feed hole, wherein the passed fraction reservoir is connected to the sorting elements by passed fraction feed holes, the passed fraction feed holes respectively connected to the sorting elements, wherein the inlet vias reservoir is connected to the sorting elements by inlet via holes, and wherein the inlet feed hole and the diverted fraction outlet feed hole are both in the sorting layer.

2. The device of claim 1, wherein feed-in channels respectively connect to the sorting elements, the feed-in channels each being connected to the inlet channels.

3. The device of claim 2, wherein other feed-in channels connect to the sorting elements, the other feed-in channels being connected to the inlet via holes.

4. The device of claim 1, wherein diverted fraction outlets respectively connect to the sorting elements.

5. The device of claim 4, wherein the diverted fraction outlets are each connected to the outlet channels.

6. The device of claim 1, wherein passed fraction outlets respectively connect to the sorting elements.

7. The device of claim 6, wherein the passed fraction outlets are connected to the passed fraction feed holes.

8. The device of claim 1, wherein the inlet channel reservoir has an external via for accessing the inlet channel reservoir.

9. The device of claim 1, wherein the diverted fraction reservoir has an external via for accessing the diverted fraction reservoir.

10. The device of claim 1, wherein the passed fraction reservoir has an external via for accessing the passed fraction reservoir.

11. The device of claim 1, wherein the sorting layer includes other banks of the sorting elements in addition to the bank of the sorting elements.

12. The device of claim 11, wherein the sorting layer includes rows of the bank of the sorting elements.

13. The device of claim 12, wherein the sorting layer includes rows of the other banks of the sorting elements.

14. The device of claim 1, wherein the sorting elements each include a nanopillar array configured to sort particles.

15. The device of claim 1, wherein the inlet channel reservoir is configured to receive a sample.

16. The device of claim 15, wherein the sample is configured to have small particles and large particles.

17. The device of claim 15, wherein the sample is selected from the group consisting of proteins, organelles, supramolecular complexes, and colloids.

18. The device of claim 15, wherein the sample include complex colloids.

19. The device of claim 18, wherein the complex colloids is selected from the group consisting of nucleic acids, RNA-protein complexes, and vesicles.

20. The device of claim 15, wherein the diverted fraction reservoir is configured to receive diverted fractions of the sample; and wherein the passed fraction reservoir is configured to received passed fractions of the sample.

* * * * *